US012770666B2

(12) United States Patent
Ahn et al.

(10) Patent No.: US 12,770,666 B2
(45) Date of Patent: Oct. 20, 2026

(54) STORAGE DEVICE

(71) Applicant: Kioxia Corporation, Tokyo (JP)

(72) Inventors: Hyung-Woo Ahn, Seongnam-si (KR); Hyungjun Cho, Seongnam-si (KR); Takuya Shimano, Seoul (KR); Naoki Akiyama, Seoul (KR); Kenichi Yoshino, Seongnam-si (KR)

(73) Assignee: Kioxia Corporation, Tokyo (JP)

( * ) Notice: Subject to any disclaimer, the term of this patent is extended or adjusted under 35 U.S.C. 154(b) by 96 days.

(21) Appl. No.: 18/828,809

(22) Filed: Sep. 9, 2024

(65) Prior Publication Data

US 2025/0087260 A1 Mar. 13, 2025

(30) Foreign Application Priority Data

Sep. 12, 2023 (JP) ................................ 2023-147700

(51) Int. Cl.

| | |
|---|---|
| ***G11C 11/16*** | (2006.01) |
| ***G11C 5/08*** | (2006.01) |
| ***H10B 61/00*** | (2023.01) |
| ***H10B 63/00*** | (2023.01) |
| ***H10N 50/10*** | (2023.01) |
| ***H10N 70/00*** | (2023.01) |

(52) U.S. Cl.

CPC .............. *G11C 11/161* (2013.01); *G11C 5/08* (2013.01); *H10B 61/10* (2023.02); *H10B 63/20* (2023.02); *H10N 50/10* (2023.02); *H10N 70/841* (2023.02); *H10N 70/882* (2023.02)

(58) Field of Classification Search

CPC ......... G11C 11/161; G11C 5/08; H10B 61/10; H10B 63/20; H10B 61/22; H10N 50/10; H10N 70/841; H10N 70/882; H10N 50/01; H10N 50/85; H10N 70/826

See application file for complete search history.

(56) References Cited

U.S. PATENT DOCUMENTS

| | | | | |
|---|---|---|---|---|
| 10,707,269 | B2 * | 7/2020 | Nagase | ................. G11C 11/161 |
| 2010/0163826 | A1 | 7/2010 | Peters | |
| 2011/0248235 | A1 | 10/2011 | Jeong et al. | |
| 2014/0106535 | A1 | 4/2014 | Lee et al. | |

(Continued)

FOREIGN PATENT DOCUMENTS

| | | |
|---|---|---|
| JP | 2020043131 A | 3/2020 |

OTHER PUBLICATIONS

Jang, et al., "Bidirectional-nonlinear threshold switching behaviors and thermally robust stability of ZnTe selectors by nitrogen annealing", Scientific Reports 10; Article 16286 (2020); https://doi.org/10.1038/s41598-020-73407-3.

(Continued)

*Primary Examiner* — Xiaochun L Chen

(74) *Attorney, Agent, or Firm* — Holtz, Holtz & Volek PC

(57) ABSTRACT

According to one embodiment, a storage device includes a stacked layer structure including a switching element, an electrode including a first electrode portion, and a variable resistance element, which are stacked in a first direction, wherein the switching element and the electrode are in contact with each other in the first direction, and a first face of the first electrode portion on a side of the switching element is in contact with a second face that is inside the stacked layer structure and that is larger than the first face.

17 Claims, 27 Drawing Sheets

(56) References Cited

U.S. PATENT DOCUMENTS

| | | | | |
|---|---|---|---|---|
| 2015/0084156 | A1* | 3/2015 | Ravasio ................. | H10B 61/00 257/528 |
| 2018/0151623 | A1 | 5/2018 | Terai | |

OTHER PUBLICATIONS

Ovshinsky, et al., "Reversible Electrical Switching Phenomena in Disordered Structures", Physical Review Letters, vol. 21, No. 20; pp. 1450-1453; Nov. 11, 1968.

* cited by examiner

STORAGE DEVICE

CROSS-REFERENCE TO RELATED APPLICATIONS

This application is based upon and claims the benefit of priority from Japanese Patent Application No. 2023-147700, filed Sep. 12, 2023, the entire contents of which are incorporated herein by reference.

FIELD

Embodiments described herein relate generally to a storage device.

BACKGROUND

There is known a storage device that stores data using a variable resistance element configured to switch resistance. The variable resistance element is coupled in series with a switching element and functions as a memory cell.

DETAILED DESCRIPTION

Figure 1:
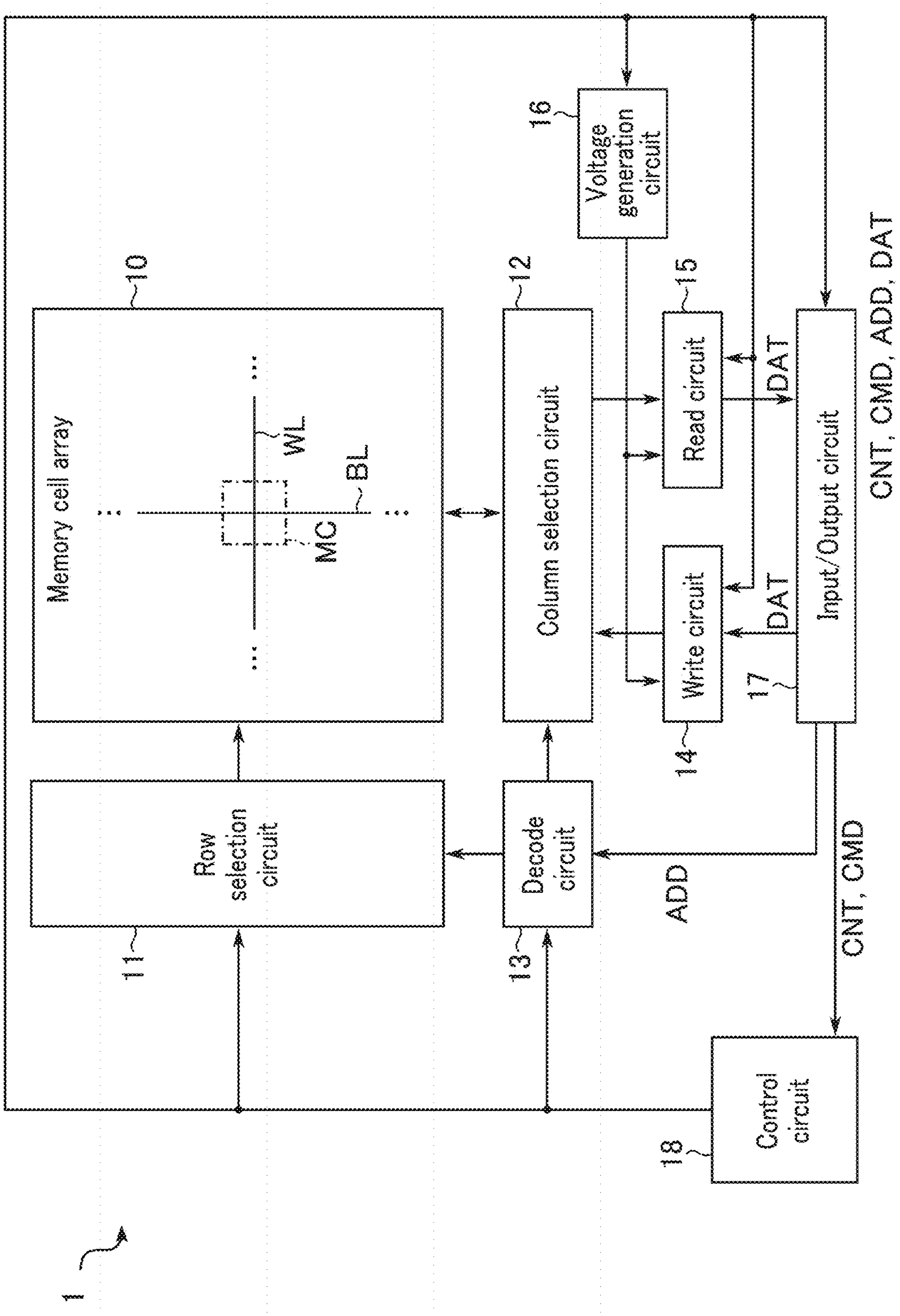
FIG. 1 is a block diagram illustrating a configuration of a storage device according to an embodiment.

In general, according to one embodiment, a storage device includes a stacked layer structure including a switching element, an electrode including a first electrode portion, and a variable resistance element, which are stacked in a first direction, wherein the switching element and the electrode are in contact with each other in the first direction, and a first face of the first electrode portion on a side of the switching element is in contact with a second face that is inside the stacked layer structure and that is larger than the first face.

Embodiments will be described with reference to the accompanying drawings. In the descriptions below, structural elements having similar functions and configurations will be denoted by the same reference symbols. To distinguish a plurality of structural elements having common reference numerals, suffixes will be attached to the common reference numerals. If the structural elements do not have to be distinguished particularly, only the common reference numerals will be used, and no suffixes will be attached. The suffixes are not limited to subscripts and superscripts, but include, for example, lowercase English letters added at the end of reference numerals, and indices or the like indicating arrangements.

1 Embodiments

A storage device according to an embodiment will be described.

The storage device according to the embodiment is a storage device that stores data using a variable resistance element. More specifically, the storage device according to the embodiment is, for example, a magnetoresistive random access memory (MRAM) using a perpendicular magnetization method, in which an element having a magnetoresistance effect due to a magnetic tunnel junction (MTJ) is used as a variable resistance element. In the description below, the variable resistance element will be referred to as an MTJ element as well. In the description below, reference will be made to a case in which a storage device is a magnetic storage device including an MTJ element as a variable resistance element; however, this is not restrictive. The storage device may include an element other than the MTJ element as the variable resistance element, and the storage device may be, for example, a resistive random access memory (ReRAM) or a phase-change random access memory (PcRAM).

1.1 Configuration

The configuration of the storage device according to the embodiment will be described.

1.1.1 Configuration of Storage Device

FIG. 1 is a block diagram showing the configuration of the storage device according to the embodiment. As shown in FIG. 1, the storage device 1 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC, each associated with a combination of a row and a column. The memory cells MC in the same row are coupled to the same word line WL. The memory cells MC in the same column are coupled to the same bit line BL.

The row selection circuit 11 is coupled to the memory cell array 10 via a word line WL. A decoding result (row address) of an address ADD from the decode circuit 13 is supplied to the row selection circuit 11. The row selection circuit 11 sets the word line WL corresponding to the row in the selected state, based on the decoding result of the address ADD. In the description below, the word line WL set in the selected state will be referred to as a selected word line WL. The word lines WL other than the selected word line WL will be referred to as non-selected word lines WL.

The column selection circuit 12 is coupled to the memory cell array 10 via a bit line BL. A decoding result (column address) of an address ADD from the decode circuit 13 is supplied to the column selection circuit 12. The column selection circuit 12 sets the bit line BL corresponding to the row in the selected state, based on the decoding result of the address ADD. In the description below, the bit line BL set in the selected state will be referred to as a selected bit line BL. The bit lines BL other than the selected bit line BL will be referred to as non-selected bit lines BL.

The decode circuit 13 decodes an address ADD supplied from the input/output circuit 17. The decode circuit 13 supplies the decoding result of the address ADD to both the row selection circuit 11 and the column selection circuit 12. An address ADD includes a selected column address and a row address.

The write circuit 14 writes data to a memory cell MC. The write circuit 14 includes, for example, a write driver (not shown).

The read circuit 15 reads data from the memory cell MC. The read circuit 15 includes, for example, a sense amplifier (not shown).

The voltage generation circuit 16 generates voltages for various operations of the memory cell array 10 by using the power supply voltage provided from an external device (not shown) of the storage device 1. For example, the voltage generation circuit 16 generates various voltages necessary for a write operation, and supplies the voltages to the write circuit 14. For example, the voltage generation circuit 16 generates various voltages necessary for a read operation, and supplies the voltages to the read circuit 15.

The input/output circuit 17 manages communication with external devices of the storage device 1. The input/output circuit 17 transfers an address ADD from the outside of the storage device 1 to the decode circuit 13. The input/output circuit 17 transfers a command CMD from the outside of the storage device 1 to the control circuit 18. The input/output circuit 17 transmits and receives various control signals CNT between the outside of the storage device 1 and the control circuit 18. The input/output circuit 17 transfers data DAT from the outside of the storage device 1 to the write circuit 14, and supplies the data DAT transferred from the read circuit 15 to the outside of the storage device 1.

Based on a control signal CNT and a command CMD, the control circuit 18 controls the operations of the row selection circuit 11, column selection circuit 12, decode circuit 13, write circuit 14, read circuit 15, voltage generation circuit 16, and input/output circuit 17 that are included in the storage device 1.

1.1.2 Configuration of Memory Cell Array

Figure 2:
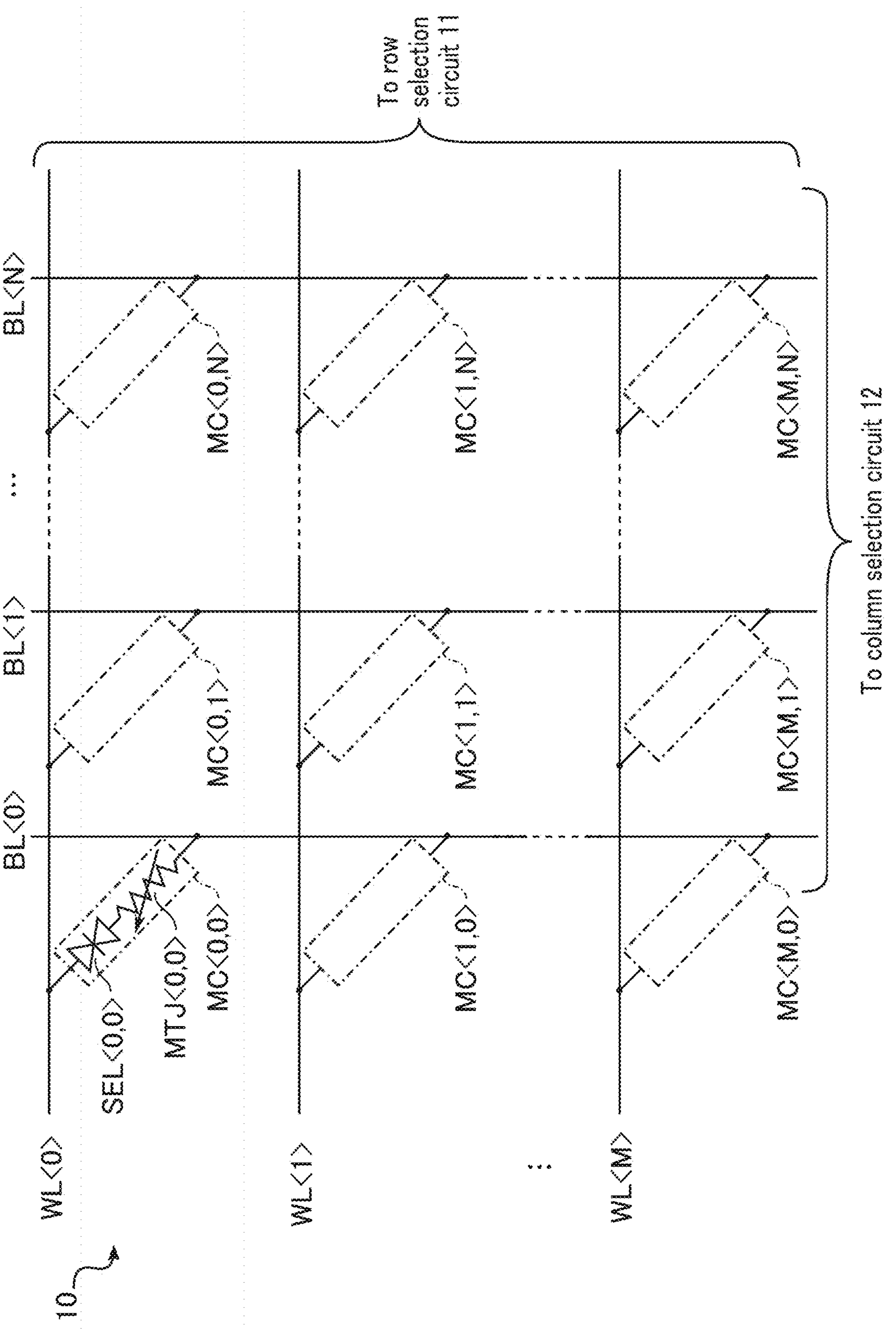
FIG. 2 is a circuit diagram for illustrating the configuration of a memory cell array of the storage device according to the embodiment.

Next, the configuration of the memory cell array of the storage device 1 according to the embodiment will be described with reference to FIG. 2. FIG. 2 is a circuit diagram showing the configuration of the memory cell array of the storage device according to the embodiment. In FIG. 2, the word lines WL are shown, classified by subscripts including an index "< >."

As shown in FIG. 2, the memory cells MC are arranged in a matrix in the memory cell array 10, and each of them is associated with a combination of one of a plurality of bit lines BL (BL<0>, BL<1>, . . . , BL<N>) and one of a plurality of word lines WL (WL<0>, WL<1>, . . . , WL<M>) (M and N are natural numbers). That is, the memory cell MC<i,j> ($0 \le i \le M$, $0 \le j \le N$; i and j are natural numbers) is coupled between the word line WL<i> and the bit line BL<j>.

The memory cell MC<i,j> includes a switching element SEL<i,j> and a magnetoresistance effect element MTJ<i,j>, which are coupled in series.

The switching element SEL is a two-terminal switching element. The two-terminal switching element differs from a three-terminal switching element such as a transistor in that it does not include a third terminal. The switching element SEL can be switched between a high resistance state and a low resistance state by a voltage applied between the two terminals. The high resistance state is, for example, an off state in which the element is electrically non-conductive. The low resistance state is, for example, an on state in which the element is electrically conductive. The switching element SEL switches between a current flow-allowing state and a current flow-blocking state, depending on the magnitude of the voltage applied to the corresponding memory cell MC, regardless of the polarity of the voltage applied between the two terminals (or the direction of the current flow).

The magnetoresistance effect element MTJ can have its resistance state switched between a low resistance state and a high resistance state by a current controlled by the switching element SEL. The magnetoresistance effect element MTJ can write data according to the change in the resistance state, and therefore functions as a memory element which can hold the written data in a nonvolatile manner and cause the data to be read.

Figure 3:
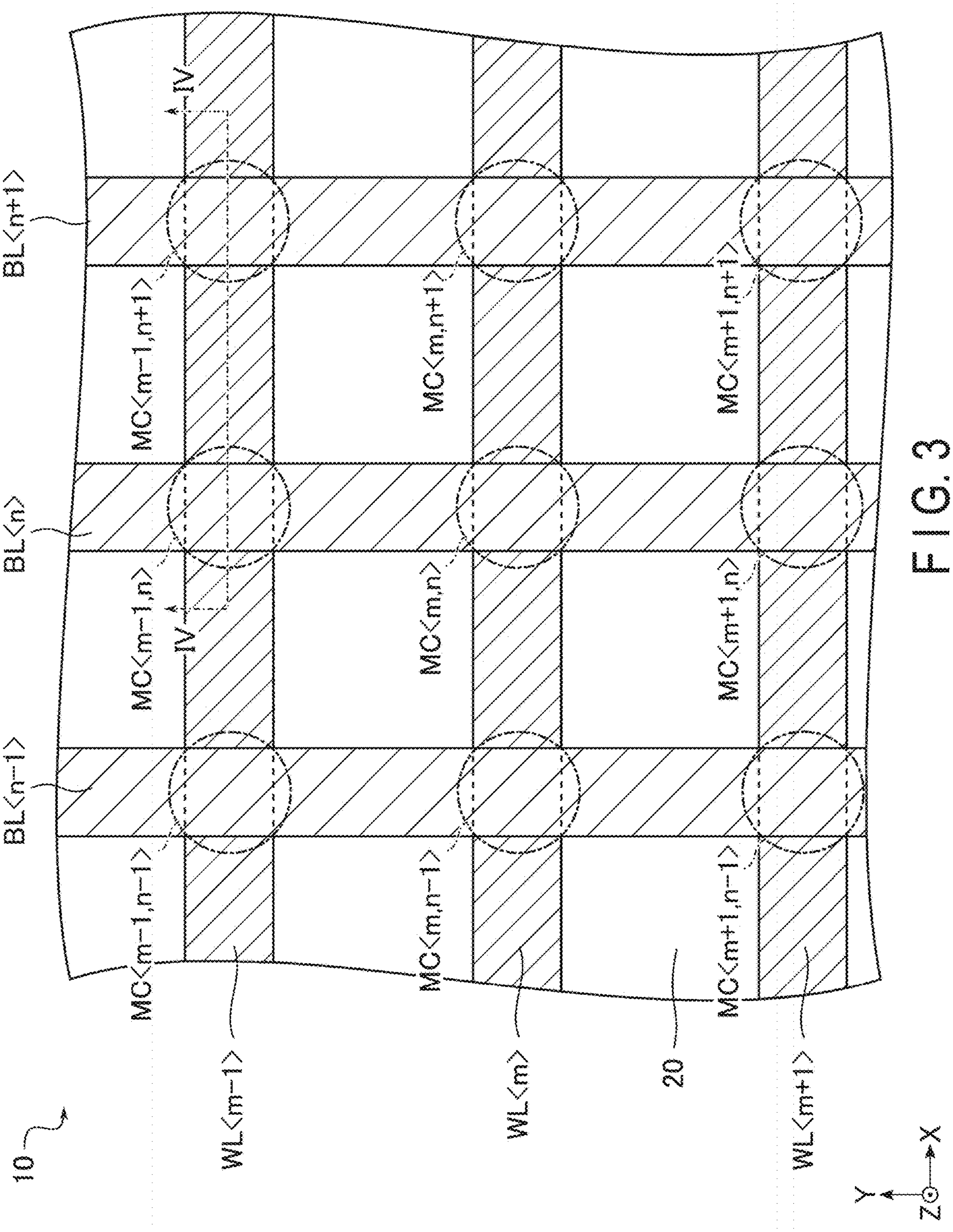
FIG. 3 is a plan view illustrating the configuration of a memory cell array of the storage device according to the embodiment.

Next, the shape of the memory cells MC in the memory cell array 10 and their arrangement in relation to the bit lines BL and word lines WL will be described with reference to FIG. 3. FIG. 3 shows an example of a plan view for illustrating the configuration of the memory cell array of the storage device according to the embodiment. FIG. 3 shows a plurality of memory cells MC (1≤m≤M−1, 1≤n≤N−1; m and n are natural numbers) included in the memory cell array 10 and provided between three word lines WL<m−1>, WL<m> and WL<m+1> and three bit lines BL<n−1>, BL<n> and BL<n+1>. For convenience of description, the interlayer insulating film is omitted in FIG. 3.

As shown in FIG. 3, the memory cell array 10 is provided above the semiconductor substrate 20. In the description below, a plane parallel to the surface of the semiconductor substrate 20 is defined as an XY plane, and a direction perpendicular to the XY plane is defined as a Z direction. A pair of directions perpendicular to each other in the XY plane are defined as an X direction and a Y direction.

The plurality of memory cells MC are provided between the word lines WL and the bit lines BL. In the example shown in FIG. 3, the word lines WL are shown below the memory cells MC, and the bit lines BL are shown above the memory cells MC; however, this is not restrictive. The vertical arrangement of the word lines WL and bit lines BL may be reversed.

The plurality of word lines WL are aligned along the Y direction. Each of the word lines WL extends along the X direction. The plurality of bit lines BL are aligned along the X direction. Each of the bit lines BL extends along the Y direction. The distance between two word lines WL and the distance between two bit lines BL can be set to be substantially equal, for example. One memory cell MC is provided at the intersection of one bit line BL and one word line WL.

Figure 4:
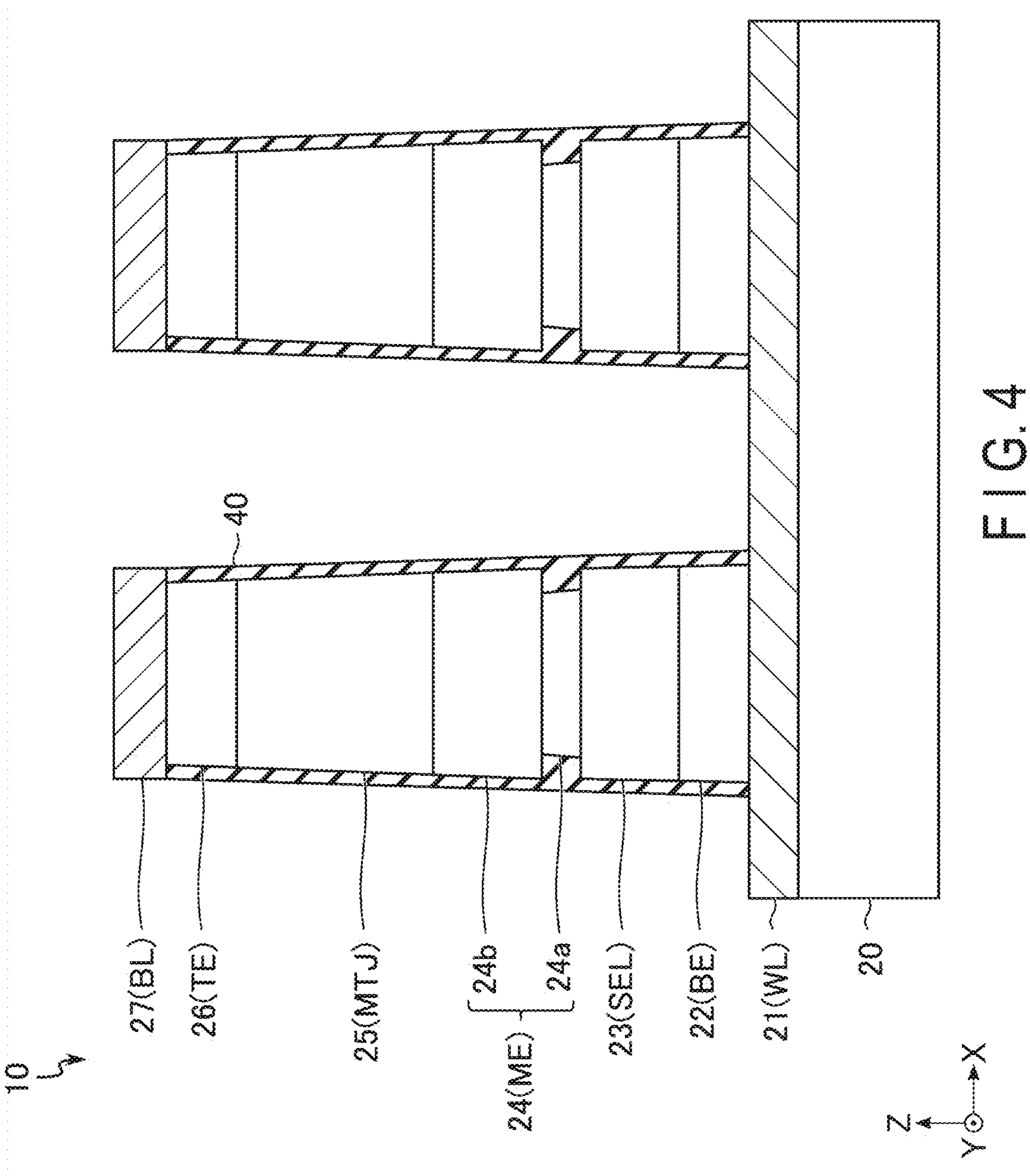
FIG. 4 is a cross-sectional view taken along line IV-IV of FIG. 3 and illustrating an example of a cross-sectional structure of the memory cell array of the storage device according to the embodiment.

Next, the cross-sectional structure of the memory cell array 10 will be described with reference to FIG. 4. FIG. 4 is a cross-sectional view taken along line IV-IV of FIG. 3 and illustrating an example of the cross-sectional structure of the memory cell array of the storage device according to the embodiment.

The memory cell array 10 is provided above the semiconductor substrate 20.

The memory cell array 10 includes a plurality of conductors 21, a plurality of electrodes 22, a plurality of elements 23, a plurality of electrodes 24, a plurality of elements 25, a plurality of electrodes 26, and a plurality of conductors 27. Each of the plurality of electrodes 24 includes electrode portions 24*a* and 24*b*.

For example, the plurality of conductors 21 are provided on the upper face of the semiconductor substrate 20. Each of the plurality of conductors 21 extends in the X direction. The plurality of conductors 21 are aligned along the Y direction in a region not shown. Each of the plurality of conductors 21 has conductivity and functions as a word line WL. Each of the plurality of conductors 21 is insulated from the others. A description was given with reference to FIG. 4 of the case where the plurality of conductors 21 are provided on the semiconductor substrate 20; however, this is not restrictive. For example, layers different from the plurality of conductors 21 and the semiconductor substrate 20 may be provided between them.

The plurality of electrodes 22 are provided on the upper face of each of the plurality of conductors 21. The plurality of electrodes 22 provided on the upper face of the same conductor 21 and are aligned in the X direction. In FIG. 4, two electrodes 22 included among the plurality of electrodes 22 are shown, and these electrodes are provided on two conductors 21, respectively. Each of the plurality of electrodes 22 has, for example, a circular shape along the XY cross section. Each of the plurality of electrodes 22 is used as a lower electrode BE.

On the upper face of each of the plurality of electrodes 22, the corresponding one element 23 of the plurality of elements 23 is provided. Each of the plurality of elements 23 has, for example, a circular shape along the XY cross section. Each of the plurality of elements 23 is used as a switching element SEL. The plurality of elements 23 includes, for example, a chalcogenide material. More specifically, each of the elements 23 may include at least one material selected from the following: hafnium oxide (HfO), a compound of arsenic, hafnium, and oxygen (AsHfO), tantalum oxide (TaO), titanium oxide (Tio), tungsten oxide (WO), zirconium oxide (ZrO), aluminum oxide (AlO), nickel oxide (NiO), niobium oxide (NbO), a compound of arsenic, silicon, oxygen, and titanium (AsSiOTi), a compound of arsenic, silicon, and oxygen (AsSiO), a compound of arsenic and sulfur (AsS), a compound of zinc and tellurium (ZnTe), a compound of arsenic, zinc, and tellurium (AsZnTe), a compound of silicon, zinc, and tellurium (SiZnTe), a compound of arsenic, silicon, zinc, and tellurium (AsSiZnTe), germanium selenide (GeSe), a compound of germanium, arsenic, selenium, and tellurium (GeAsSeTe), a compound of germanium and telluride (GeTe), a compound of carbon and tellurium (CTe), a compound of silicon, arsenic, and tellurium (SiAsTe), a compound of silicon, germanium, arsenic, and tellurium (SiGeAsTe), a compound of germanium, arsenic, and tellurium (GeAsTe), a compound of arsenic and tellurium (AsTe), and a compound of silicon, germanium, arsenic, and selenium (SiGeAsSe), and compounds of the chalcogenides mentioned above with at least one element selected from carbon (C), nitrogen (N), indium (In), and boron (B). Additionally, each of the plurality of elements 23 may include at least one kind of material selected from a compound of arsenic and germanium (GeAs), and a compound of that compound with at least one element selected from carbon (C), nitrogen (N), indium (In), and boron (B). The plurality of elements 23 have, for example, an amorphous structure. Furthermore, it is preferable that the plurality of elements 23 include at least one element selected from among the Group V elements and the Group VI elements. If the plurality of elements 23 include at least one element selected from among the Group V elements and the Group VI elements, the density of trap sites in the plurality of elements 23 can be increased and the band gap width can be increased. Thus, conductive filaments can be easily formed in the plurality of elements 23 by the forming process described below.

On the upper face of each of the plurality of elements 23, a corresponding one electrode 24 of the plurality of electrodes 24 is provided. Each of the plurality of electrodes 24 is used as an intermediate electrode ME.

The plurality of electrodes 24 will be described in more detail.

On the upper face of each of the plurality of elements 23, a corresponding one electrode portion 24*a* of the plurality of electrode portions 24*a* is provided. Each of the plurality of electrode portions 24*a* has, for example, a circular shape along the XY cross section. The outer diameter of the lower face of each of the plurality of electrode portions 24*a* is smaller than the outer diameter of the upper face of the element 23 corresponding to that electrode portion 24*a*. As a result, the area of the lower face of each of the plurality of electrode portions 24*a* is smaller than the area of the upper face of the element 23 corresponding to that electrode portion 24*a*. The electrode portion 24*a* includes carbon (C), for example. The electrode portion 24*a* has, for example, an amorphous structure.

On the upper face of each of the electrode portions 24*a*, a corresponding one electrode portion 24*b* of the plurality of electrode portions 24*b* is provided. Each of the plurality of electrode portions 24*b* has, for example, a circular shape along the XY cross section. The outer diameter of the lower face of each of the plurality of electrode portions 24*b* is larger than the outer diameter of the upper face of the electrode portion 24*a* corresponding to that electrode portion 24*b*. Thus, the area of the lower face of each of the plurality of electrode portions 24*b* is larger than the area of the upper face of the electrode portion 24*a* corresponding to that electrode portion 24*b*. The electrode portion 24*b* includes, for example, titanium (Ti), tungsten (W), titanium nitride (TiN), tungsten nitride (WN), titanium nitride (TiWN) containing tungsten, etc.

It should be noted that in the entire region along the Z direction, the outer diameter of each of the plurality of electrode portions 24*a* is smaller, for example, than the outer diameter of the upper face of the element 23 corresponding to that electrode portion 24*a* and the outer diameter of the lower face of the electrode portion 24*b* corresponding to that electrode portion 24*a*.

A corresponding one element 25 of the plurality of elements 25 is provided on the upper face of each of the plurality of electrode portions 24*b*. Each of the plurality of elements 25 has, for example, a circular shape along the XY cross section. Each of the plurality of elements 25 functions as a magnetoresistance effect element MTJ. Details of the configuration of the element 25 will be described later.

On the upper face of each of the plurality of elements 25, a corresponding one electrode 26 of the plurality of electrodes 26 is provided. Each of the plurality of electrodes 26 has, for example, a circular shape along the XY cross section. Each of the plurality of electrodes 26 is used as an upper electrode TE.

With the above configuration, a plurality of structures, each including the electrodes 22, 24, and 26 and the elements 23 and 25, are also referred to as a plurality of stacked layer structures. Each of the plurality of stacked layer structures corresponds to one of the plurality of memory cells MC. Furthermore, with the above configuration, each of the plurality of memory cells MC has, for example, a circular shape along the XY cross section.

A sidewall insulator 40 is provided on the side face of each of the plurality of stacked layer structures in such a manner as to cover the side face. The sidewall insulator 40 is provided, for example, up to the same height as the upper face of the electrode 26. The sidewall insulator 40 may include a plurality of insulating materials.

The plurality of conductors 27 are aligned along the X direction. Although not shown, each of the plurality of conductors 27 extends along the Y direction in such manner as to come into contact with the upper face of each of the plurality of electrodes 26 aligned in the Y direction. Each of the plurality of conductors 27 is conductive and functions as a bit line BL.

1.1.3 Magnetoresistance Effect Element

Figure 5:
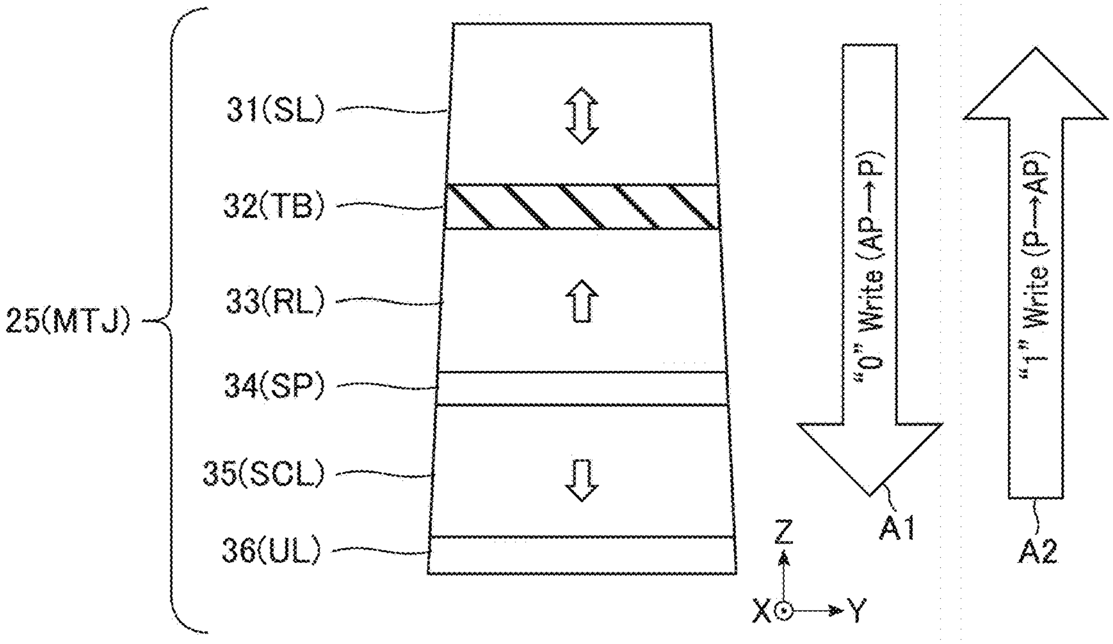
FIG. 5 is a cross-sectional view illustrating the configuration of a magnetoresistance effect element of the storage device according to the embodiment.

Next, the configuration of the magnetoresistance effect element MTJ of the storage device 1 according to the embodiment will be described with reference to FIG. 5. FIG. 5 is a cross-sectional view showing the configuration of the magnetoresistance effect element of the storage device according to the embodiment.

The element 25 used as the magnetoresistance effect element MTJ includes a ferromagnetic body 31, a nonmagnetic body 32, a ferromagnetic body 33, a nonmagnetic body 34, a ferromagnetic body 35, and a nonmagnetic body 36.

The ferromagnetic body 31 is a conductive film having ferromagnetism. The ferromagnetic body 31 has an easy magnetization axis direction in a direction perpendicular to the film face (Z direction). The ferromagnetic body 31 includes iron (Fe). The ferromagnetic body 31 may further include at least one element selected from between cobalt (Co) and nickel (Ni). The ferromagnetic body 31 may further include boron (B). More specifically, the ferromagnetic body 31 includes, for example, cobalt iron boron (CoFeB), iron boride (FeB), or cobalt boride (CoB). The ferromagnetic body 31 is used as a storage layer SL.

A nonmagnetic body 32 is provided on the lower face of the ferromagnetic body 31. The nonmagnetic body 32 is an insulating film having a nonmagnetic property. The nonmagnetic body 32 is used as a tunnel barrier layer TB. The nonmagnetic body 32 is provided between the ferromagnetic body 31 and the ferromagnetic body 33, and forms a magnetic tunnel junction together with the ferromagnetic body 31 and the ferromagnetic body 33. The nonmagnetic body 32 acts as a seed material that nucleates the growth of a crystalline film from the interface with the ferromagnetic body 31 during the crystallization process of the ferromagnetic body 31. The nonmagnetic body 32 has an NaCl crystal structure with its film face oriented in the (001) plane. The nonmagnetic body 32 includes, for example, magnesium oxide (MgO).

The ferromagnetic body 33 is provided on the lower face of the nonmagnetic body 32. The ferromagnetic body 33 is a conductive film having ferromagnetism. The ferromagnetic body 33 is used as a reference layer RL. The ferromagnetic body 33 has an easy magnetization axis direction in a direction perpendicular to the film face (Z direction). The magnetization direction of the ferromagnetic body 33 is fixed. In the example shown in FIG. 5, the magnetization direction of the ferromagnetic body 33 is from the ferromagnetic body 33 toward the ferromagnetic body 31. It should be noted that the phrase "the magnetization direction is fixed" means that the magnetization direction does not change, even under a torque strong enough to reverse the magnetization of the ferromagnetic body 31. The ferromagnetic body 33 includes at least one kind of compound selected from, for example, cobalt platinum (CoPt), cobalt nickel (CoNi), and cobalt palladium (CoPd).

The nonmagnetic body 34 is provided on the lower face of the ferromagnetic body 33. The nonmagnetic body 34 is a conductive film having a nonmagnetic property. The nonmagnetic body 34 is used as a spacer layer SP. The nonmagnetic body 34 includes at least one element selected from the group including, for example, ruthenium (Ru), osmium (Os), rhodium (Rh), iridium (Ir), vanadium (V), and chromium (Cr).

The ferromagnetic body 35 is provided on the lower face of the nonmagnetic body 34. The ferromagnetic body 35 is a conductive film having ferromagnetism. The ferromagnetic body 35 is used as a shift cancel layer SCL. The ferromagnetic body 35 has an easy magnetization axis direction in a direction perpendicular to the film face (Z direction). The magnetization direction of the ferromagnetic body 35 is fixed. In the example shown in FIG. 5, the magnetization direction of the ferromagnetic body 35 is from the ferromagnetic body 33 toward the ferromagnetic body 35. The ferromagnetic body 35 includes at least one kind of compound selected from, for example, cobalt platinum (CoPt), cobalt nickel (CoNi), and cobalt palladium (CoPd).

The ferromagnetic body 33 and the ferromagnetic body 35 are anti-ferromagnetically coupled to each other by the nonmagnetic body 34. In other words, the ferromagnetic body 33 and the ferromagnetic body 35 are coupled such that their magnetization directions are anti-parallel. This coupling structure among the ferromagnetic body 33, the nonmagnetic body 34, and the ferromagnetic body 35 is referred to as an SAF (Synthetic Anti-Ferromagnetic) structure. The SAF structure enables the ferromagnetic body 35 to cancel the effect which the leakage magnetic field from the ferromagnetic body 33 has on the change in the magnetization direction of the ferromagnetic body 31. Thus, the ferromagnetic body 35 can effectively reduce the leakage magnetic field of the ferromagnetic body 33.

The nonmagnetic body 36 is provided on the lower face of the ferromagnetic body 35. The nonmagnetic body 36 is a conductive film having a nonmagnetic property. The nonmagnetic body 36 is used as an underlayer UL. The nonmagnetic body 38 includes at least one element selected from the group including, for example, zirconium (Zr), hafnium (Hf), tungsten (W), chromium (Cr), molybdenum (Mo), niobium (Nb), titanium (Ti), tantalum (Ta), vanadium (V), ruthenium (Ru), and platinum (Pt).

The magnetoresistance effect element MTJ can be in either a low resistance state or a high resistance state, depending on whether the magnetization directions of the storage layer (SL) and the reference layer (RL) are parallel or anti-parallel. In the embodiment, a write current is made to flow through such a magnetoresistance effect element MTJ to control the magnetization direction of the storage layer SL relative to that of the reference layer RL. Specifically, a write method utilizing spin transfer torque generated by the current flowing through the magnetoresistance effect element MTJ is adopted.

In a case where a write current Ic0 of a certain magnitude is made to flow through the magnetoresistance effect element MTJ in the direction from the storage layer SL toward the reference layer RL, i.e., in the direction of arrow A1 in FIG. 5, the relationship between the magnetization directions of the storage layer SL and the reference layer RL becomes parallel. In this parallel state, the resistance value of the magnetoresistance effect element MTJ is smallest, and the magnetoresistance effect element MTJ is in the low resistance state. This low resistance state is referred to as a "P (parallel) state," and is defined, for example, as a state of data "0."

Furthermore, in a case where a write current Ic1 larger than the write current Ic0 is made to flow through the magnetoresistance effect element MTJ in the direction from the reference layer RL toward the storage layer SL, i.e., in the direction of arrow A2 in FIG. 5, the relationship between the magnetization directions of the storage layer SL and the reference layer RL becomes anti-parallel. In this anti-parallel state, the resistance value of the magnetoresistance effect element MTJ is largest, and the magnetoresistance effect element MTJ is in the high resistance state. This high resistance state is referred to as an "AP (Anti-Parallel) state," and is defined, for example, as a state of data "1."

It should be noted that the manner in which data "1" and data "0" are defined is not limited to the example described above. For example, the P state may be defined as data "1" and the AP state may be defined as data "0."

1.1.4 Characteristics of Switching Element

Figure 6:
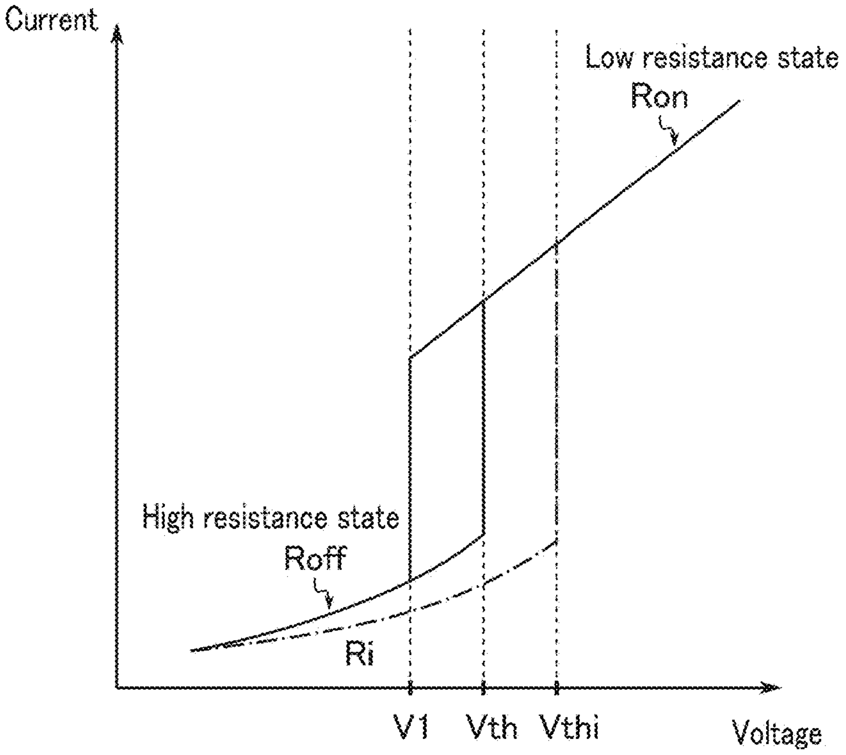
FIG. 6 is a diagram showing an example of the characteristics of a switching element according to the embodiment.

Next, the characteristics of the switching element SEL will be described with reference to FIG. 6. FIG. 6 is a diagram showing an example of the characteristics of the switching element. In FIG. 6, the vertical axis and the horizontal axis respectively show a current flowing through the switching element SEL and a voltage applied between the terminals of the switching element SEL.

In a case where the voltage between the terminals of the switching element SEL in the high resistance state is increased, the resistance between the terminals of the switching element SEL (hereinafter simply referred to as the resistance of the switching element SEL) drops suddenly from resistance Roff to resistance Ron (Roff> Ron) at the threshold voltage Vth of the switching element SEL, as shown by the solid line in FIG. 6. In other words, the switching element SEL changes from a high resistance state to a low resistance state. As a result, the current flowing through the switching element SEL increases suddenly. On the other hand, in a case where the voltage between the terminals of the switching element SEL in the low resistance state is decreased, the resistance value increases suddenly from resistance Ron to resistance Roff, for example, at a voltage V1 lower than the threshold voltage Vth. In other words, the switching element SEL changes from a low resistance state to a high resistance state. This causes a sudden decrease in the amount of current flowing through the switching element SEL.

Before shipment of the storage device 1, a forming process is performed to change the characteristics of the switching element SEL from an initial state to the usage state described above. The device is used in this usage state. In the high resistance state of the switching element SEL in the initial state, resistance Ri is higher than resistance Roff in the high resistance state of the switching element SEL in the usage state (Ri> Roff). If, in the forming process, the voltage between the terminals of the switching element SEL in the initial state is increased, the resistance value suddenly drops, for example, from resistance Ri to resistance Ron (Ri> Ron) at the threshold voltage Vthi of the switching element SEL, as indicated by the dot-and-dash line in FIG. 6. The threshold voltage Vthi is higher than the threshold voltage Vth. In the forming process, a voltage is applied between the terminals of the switching element SEL in the initial state, thereby forming a conductive filament in the switching element SEL. As a result, the state of the switching element SEL changes from the initial state to the usage state. In addition, the threshold voltage of the switching element SEL decreases from the threshold voltage Vthi to the threshold voltage Vth.

1.2 Manufacturing Method of Memory Cell Array

In what follows, a first manufacturing method and a second manufacturing method will be described as examples of the manufacturing method of the memory cell array 10 according to the embodiment.

1.2.1 First Manufacturing Method

The first manufacturing method of the memory cell array 10 of the storage device 1 according to the embodiment will be described.

Figure 7:
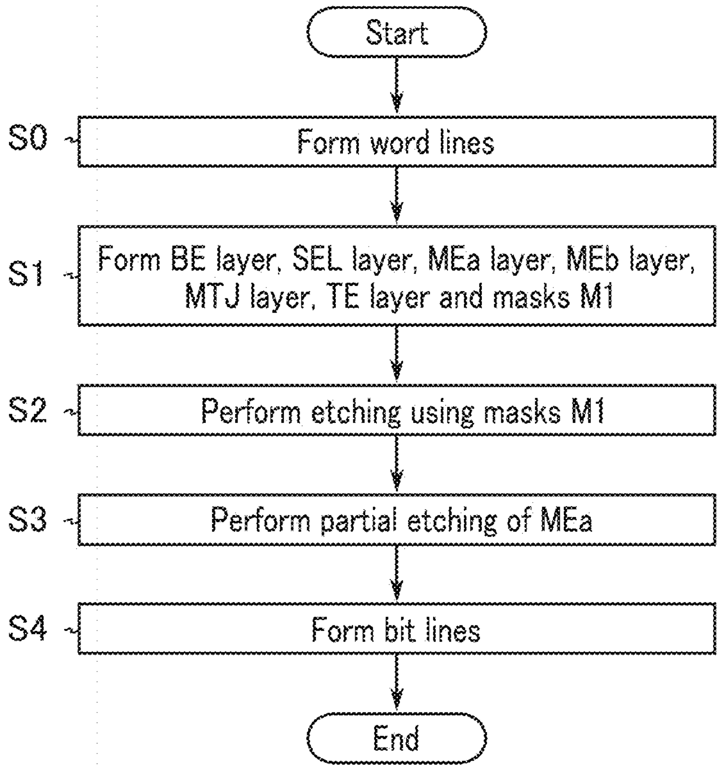
FIG. 7 is a flowchart for illustrating a method for manufacturing the memory cell array used in the storage device according to the embodiment.
Figure 8:
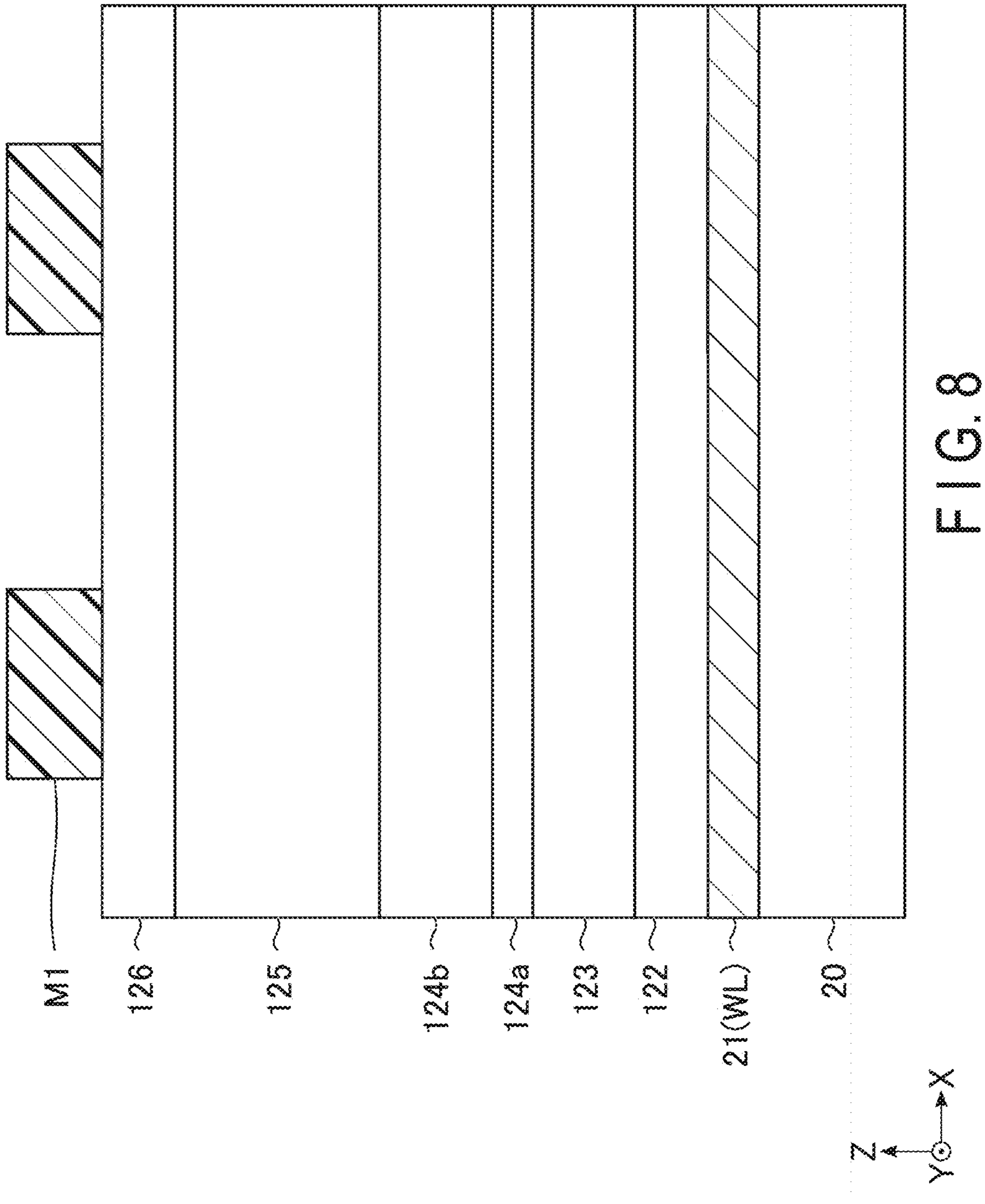
FIG. 8 is a cross-sectional view for illustrating a method for manufacturing the memory cell array used in the storage device according to the embodiment.
Figure 9:
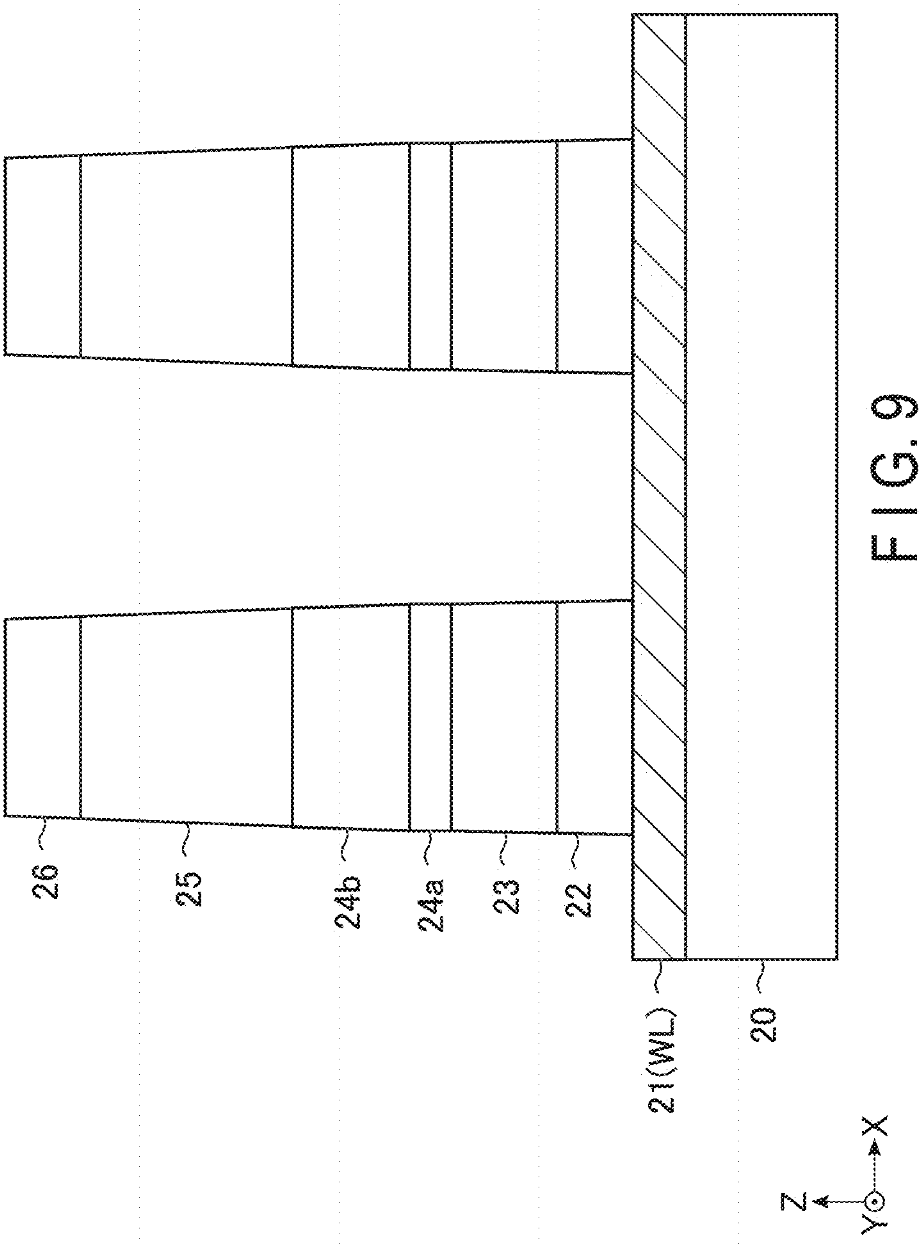
FIG. 9 is a cross-sectional view for illustrating a method for manufacturing the memory cell array used in the storage device according to the embodiment.
Figure 10:
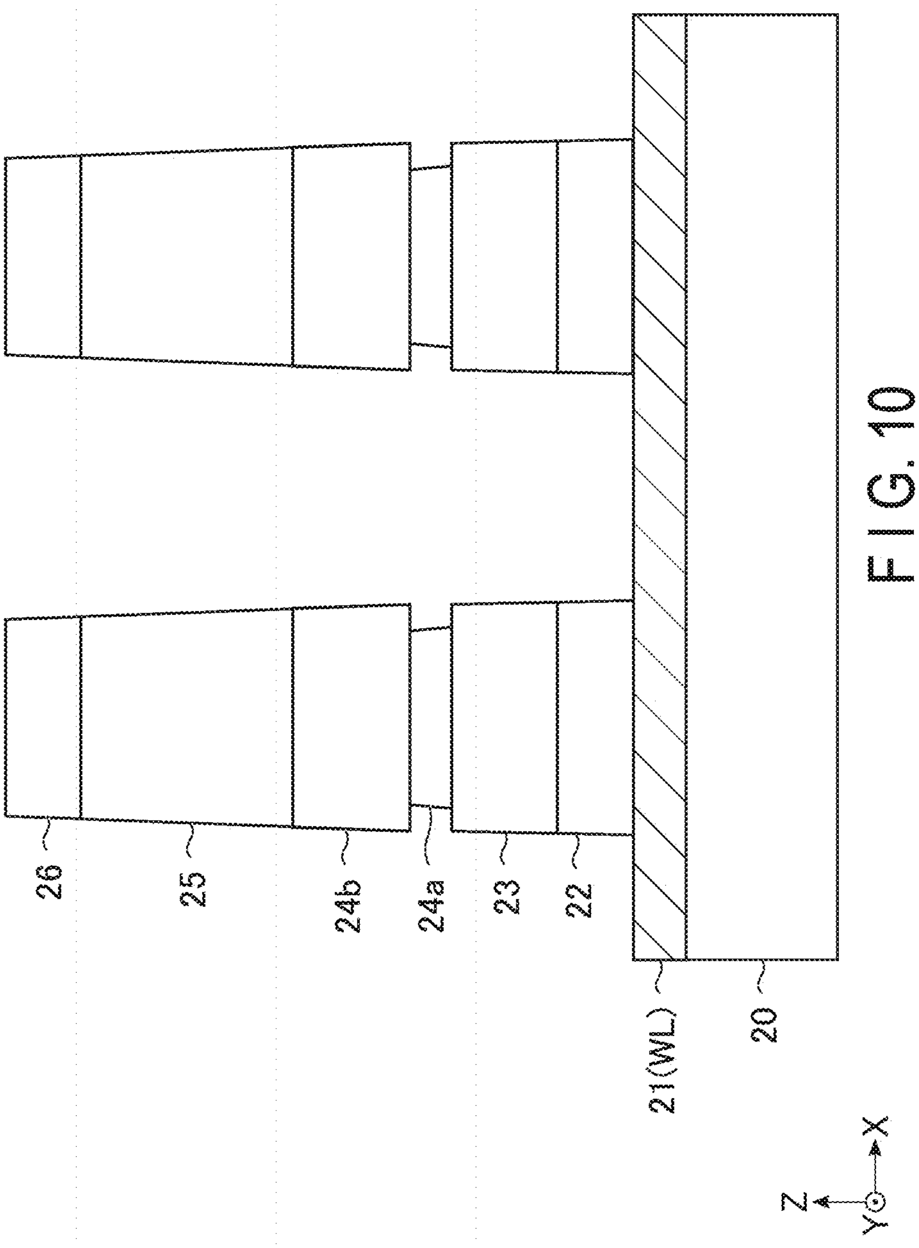
FIG. 10 is a cross-sectional view for illustrating a method for manufacturing the memory cell array used in the storage device according to the embodiment.

FIG. 7 is a flowchart for illustrating the manufacturing method of the memory cell array used in the storage device according to the embodiment. FIG. 8 through FIG. 10 are cross-sectional views for illustrating the manufacturing method of the memory cell array used in the storage device according to the embodiment. FIG. 8 through FIG. 10 are cross-sectional views corresponding to FIG. 4.

In S0, a plurality of conductors 21, serving as a plurality of word lines WL, are provided on the upper face of a semiconductor substrate 20, which is a wafer WF. Specifically, a conductor layer is first provided on the upper face of the semiconductor substrate 20, and then a mask is formed by photolithography or the like such that a region excluding the portion corresponding to the word line WL is open. Subsequently, the conductor layer is divided by anisotropic etching using the formed mask to form a plurality of conductors 21, and holes reaching the semiconductor substrate 20 are formed. The anisotropic etching used in this process is, for example, RIE (reactive-ion etching). Then, an insulator is provided within the formed holes.

Next, in S1, as shown in FIG. 8, an electrode layer 122, a switching element layer 123, electrode layers 124*a* and 124*b*, a magnetoresistance effect element layer 125, an electrode layer 126, and a plurality of masks M1 are formed in this order on the upper faces of the plurality of conductors 21 and the insulator (not shown). In the description given below with reference to FIG. 7, the electrode layer 122, the switching element layer 123, the electrode layers 124*a* and 124*b*, the magnetoresistance effect element layer 125, and the electrode layer 126 will also be referred to as a BE layer, an SEL layer, an MEa layer, an MEb layer, an MTJ layer, and a TE layer, respectively. The magnetoresistance effect element layer 125 is a stacked layer body in which the layers included in the magnetoresistance effect element MTJ described with reference to FIG. 5 are formed in this stacking order in such a manner as to have a flat plate shape. The plurality of masks M1 are formed by photolithography or the like, such that they are open at the regions corresponding to the lower electrode BE, the switching element SEL, the intermediate electrode ME, the magnetoresistance effect element MTJ, and the upper electrode TE, and they cover the regions corresponding to the electrode layer 122, the switching element layer 123, the electrode layers 124*a* and 124*b*, the magnetoresistance effect element layer 125, and the electrode layer 126. The plurality of masks M1 are provided, for example, as a plurality of cylindrical structures arranged in a matrix on the upper face of the electrode layer 126. The plurality of masks M1 include titanium nitride (TiN), for example, and protect the portions that function as the lower electrode BE, the switching element SEL, the intermediate electrode ME, the magnetoresistance effect element MTJ, and the upper electrode TE, during ion beam etching described later.

In S2, the electrode layer 122, the switching element layer 123, the electrode layers 124*a* and 124*b*, the magnetoresistance effect element layer 125, and the electrode layer 126 are etched by ion beam etching. Thus, the electrode layer 122, the switching element layer 123, the electrode layers 124*a* and 124*b*, the magnetoresistance effect element layer 125, and the electrode layer 126 are removed at the portions not protected by the plurality of masks M1, with the result that a conductor 21 and an insulator (not shown) located below those portions are exposed. Then, the masks M1 are removed. By the above processing, the plurality of stacked layer structures, each including electrodes 22, 24, and 26 and elements 23 and 25, are formed from the electrode layer 122, the switching element layer 123, the electrode layers 124*a* and 124*b*, magnetoresistance effect element layer 125, and the electrode layer 126, as shown in FIG. 9.

Then, in S3, the electrode portion 24*a* is partially removed, as shown in FIG. 10. More specifically, that portion of the electrode portion 24*a* which is exposed is removed, for example, by dry etching using oxygen plasma. In the process of S3, the etching selectivity of the electrode portion 24*a* is higher than the etching selectivity of the conductor 21, the electrodes 22 and 26, the electrode portion 24*b*, the elements 23 and 25, and the insulator (not shown).

In S4, a sidewall insulator 40 is formed, and then a plurality of conductors 27 are provided. More specifically, the sidewall insulator 40 is formed in such a manner as to cover the side faces of each of the plurality of stacked layer structures. Then, an insulator (not shown) is embedded between the plurality of stacked layer structures on which the sidewall insulator 40 is provided, for example, up to a height equal to that of the upper face of the electrode 26. In addition, after a conductor layer is provided on the upper face of the electrode 26 and the insulator, a mask is formed by photolithography or the like such that a region excluding the portion corresponding to the bit line BL is open. Subsequently, the conductor layer is divided by anisotropic etching using the formed mask to form a plurality of conductors 27, and holes reaching the insulator are formed. The anisotropic etching used in the present step is, for example, RIE. Then, an insulator is provided within the formed holes.

As a result of the above, a configuration corresponding to the memory cell array 10 is formed on the wafer WF by the first manufacturing method. The wafer WF is then diced into chips to form the storage devices 1.

1.2.2 Second Manufacturing Method

The second manufacturing method of the memory cell array 10 of the storage device 1 according to the embodiment will be described.

Figure 11:
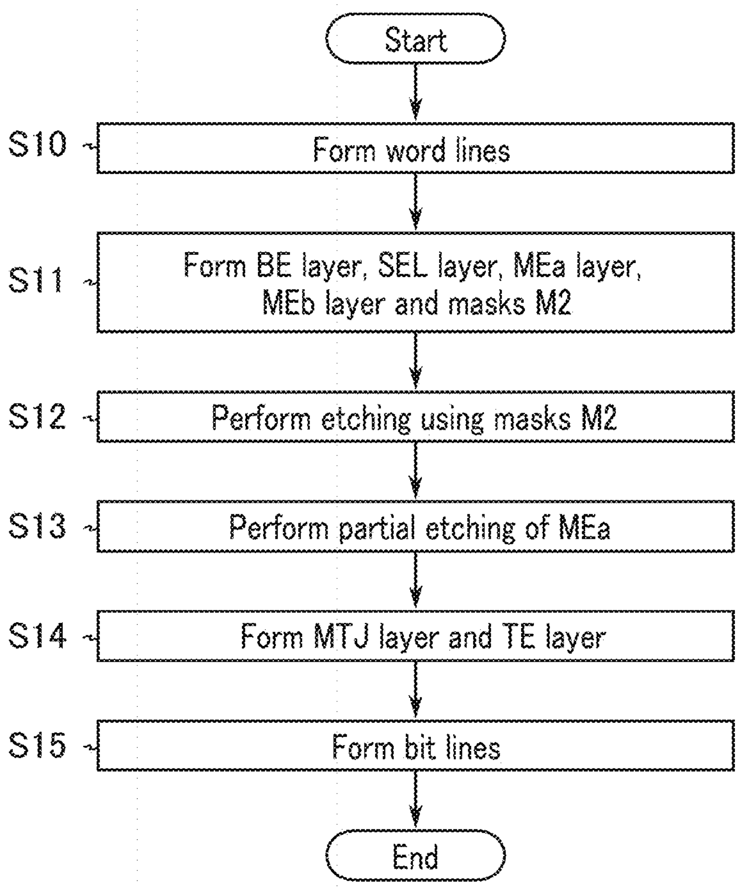
FIG. 11 is a flowchart for illustrating a method for manufacturing the memory cell array used in the storage device according to the embodiment.
Figure 12:
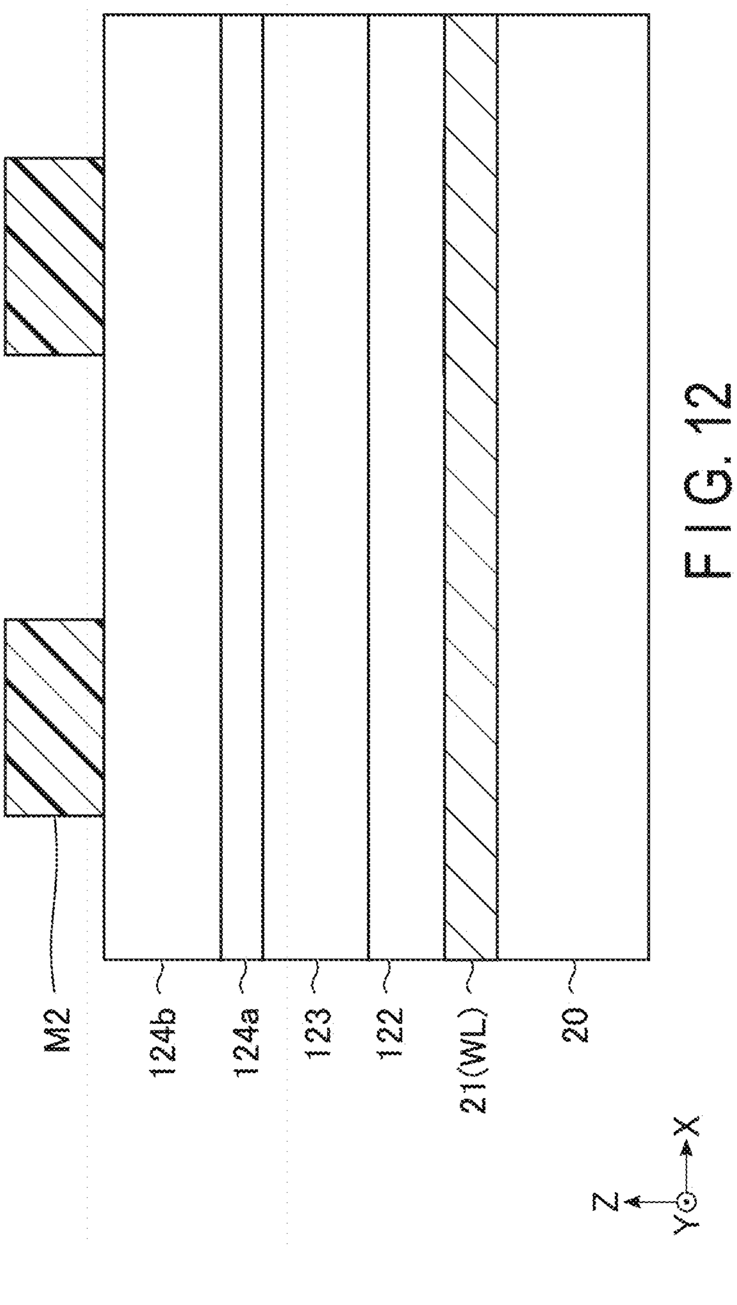
FIG. 12 is a cross-sectional view for illustrating a method for manufacturing the memory cell array used in the storage device according to the embodiment.
Figure 13:
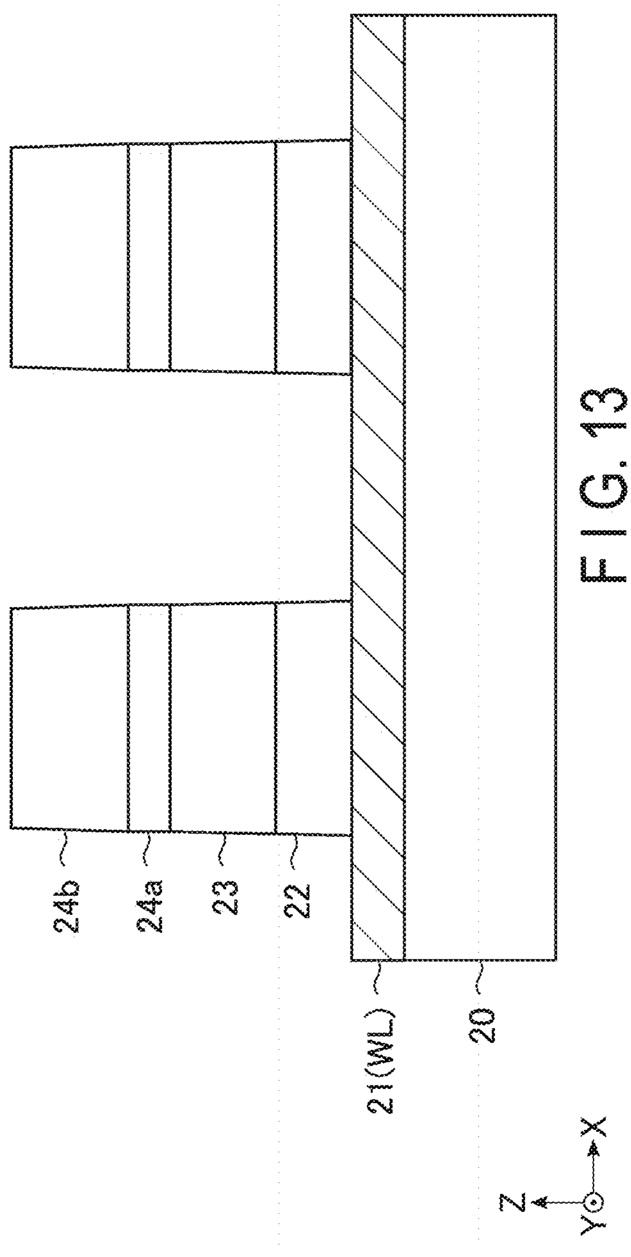
FIG. 13 is a cross-sectional view for illustrating a method for manufacturing the memory cell array used in the storage device according to the embodiment.
Figure 14:
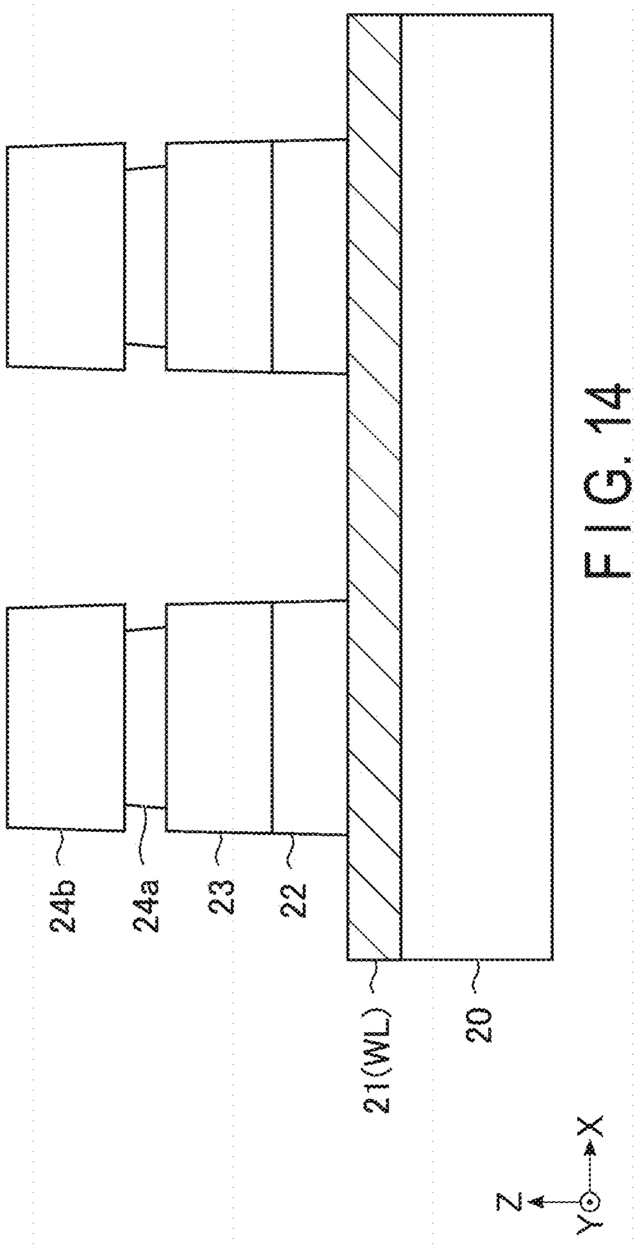
FIG. 14 is a cross-sectional view for illustrating a method for manufacturing the memory cell array used in the storage device according to the embodiment.

FIG. 11 is a flowchart for illustrating the manufacturing method of the memory cell array used in the storage device according to the embodiment. FIG. 12 through FIG. 14 are cross-sectional views for illustrating the manufacturing method of the memory cell array used in the storage device according to the embodiment. FIG. 12 through FIG. 14 are cross-sectional views corresponding to FIG. 4.

The process of S10 is similar to the process of S0 of the first manufacturing method.

In S11, as shown in FIG. 12, an electrode layer 122, a switching element layer 123, electrode layers 124*a* and 124*b*, and a plurality of masks M2 are formed in this order on the upper faces of a plurality of conductors 21 and an insulator (not shown). The plurality of masks M2 are formed by photolithography or the like, such that they are open at the regions corresponding to the lower electrode BE, the switching element SEL, and the intermediate electrode ME, and they cover the regions corresponding to the electrode layer 122, the switching element layer 123, and the electrode layers 124*a* and 124*b*. The plurality of masks M2 are provided, for example, as a plurality of cylindrical structures arranged in a matrix on the upper face of the electrode layer 126. The plurality of masks M2 include titanium nitride (TiN), for example, and protect the portions that function as the lower electrode BE, the switching element SEL, and the intermediate electrode ME, during the ion beam etching described later.

In S12, the electrode layer 122, the switching element layer 123, and the electrode layers 124*a* and 124*b* are etched by ion beam etching using the masks M2. Thus, the electrode layer 122, the switching element layer 123, and the electrode layers 124*a* and 124*b* are removed at the portions not protected by the plurality of masks M2, with the result that a conductor 21 and an insulator (not shown) located below those portions are exposed. Then, the masks M2 are removed. By the above processing, a plurality of structures, each including electrodes 22 and 24 and an element 23, are formed from the electrode layer 122, the switching element layer 123, and the electrode layers 124*a* and 124*b*, as shown in FIG. 13.

Then, in S13, as shown in FIG. 14, the electrode portion 24*a* is partially removed. The process in S13 is substantially similar to the process in S3.

Next, in S14, a structure including element 25 and electrode 26 in this order is formed on each of a plurality of stacked layer structures including electrodes 22 and 24 and element 23. The process of S14 is performed, for example, after the plurality of stacked layer structures including electrodes 22 and 24 and element 23 are embedded with an insulator.

The process in S15 is substantially similar to the process in S5.

As a result of the above, a configuration corresponding to the memory cell array 10 is formed on the wafer WF by the second manufacturing method. The wafer WF is then diced into chips to form the storage devices 1, as in the first manufacturing method.

1.3 Advantages of Embodiment

According to the embodiment, the characteristics of the storage device can be improved. The advantages of the embodiment will be described below.

The memory cell MC of the storage device 1 according to the embodiment is configured as a stacked layer structure including elements 23 and 25 and an electrode 24 which are stacked in the Z direction. The electrode 24 includes electrode portions 24*a* and 24*b*. The lower face of the electrode portion 24*a* is in contact with the upper face of the element 23. The area of the lower face of the electrode portion 24*a* is smaller than the area of the upper face of the element 23. With the configuration in which the face of the electrode portion 24*a* on the element 23 side is in contact with a larger-area face in the stacked layer structure, a decrease in the resistance Roff of the switching element in the off state can be suppressed and an increase in the current Ioff flowing through the element 23 in the off state can be suppressed. This suppresses an erroneous read during a read operation. Therefore, the characteristics of the storage device can be improved.

Additionally, if the resistance Roff is not sufficiently high relative to the resistance Ron in a storage device, a read operation may fail for a certain memory cell because a sneak current may flow into memory cells adjacent to that memory cell in the Z direction. This may prevent a normal read operation from being performed and may result in an erroneous read.

According to the embodiment, the resistance Roff can be increased and the current Ioff can be reduced in comparison with the case (the case of a comparative example) where an electrode and a switching element in contact with each other have substantially similar contact faces and the area of the electrode in the XY plane is continuous or uniform in the Z direction. Furthermore, even with the configuration of the embodiment, the threshold voltage Vth can be maintained approximately equal to that of the comparative example. Therefore, the occurrence of sneak current can be suppressed and an erroneous read can be suppressed without affecting the operation of the storage device 1.

2 Modifications

The embodiment described above can be modified in various manners. Modifications will be described below.

2.1 First Modification

In connection with the embodiment described above, reference was made to the case where the electrode portion 24*a* has a circular shape when viewed from above; however, this is not restrictive. The electrode portion 24*a* may have a ring shape when viewed from above.

The configuration and manufacturing method of the storage device according to the first modification will be described below.

2.1.1 Configuration

Figure 15:
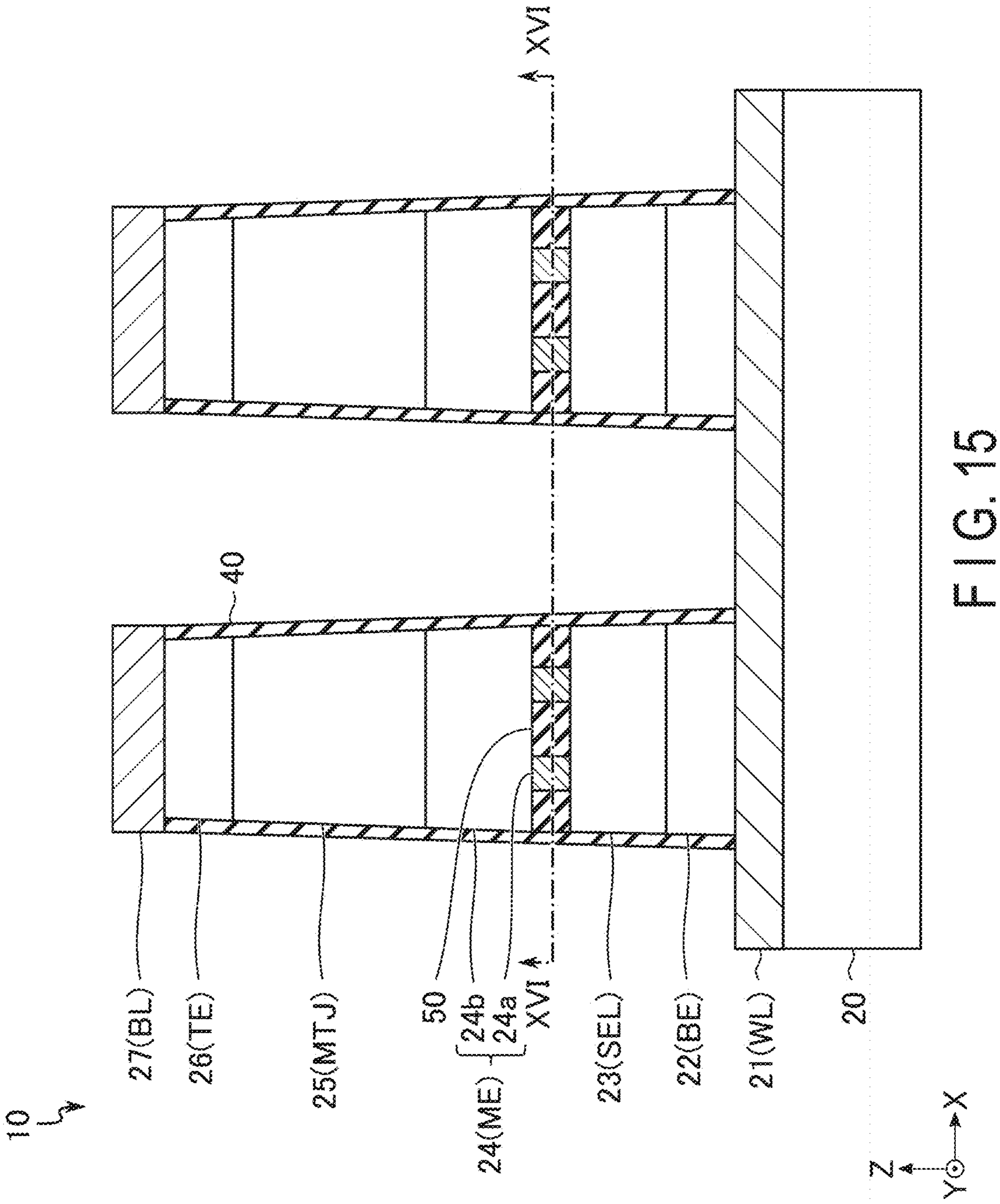
FIG. 15 is a cross-sectional view showing an example of a cross-sectional structure of a memory cell array used in a storage device according to a first modification.
Figure 16:
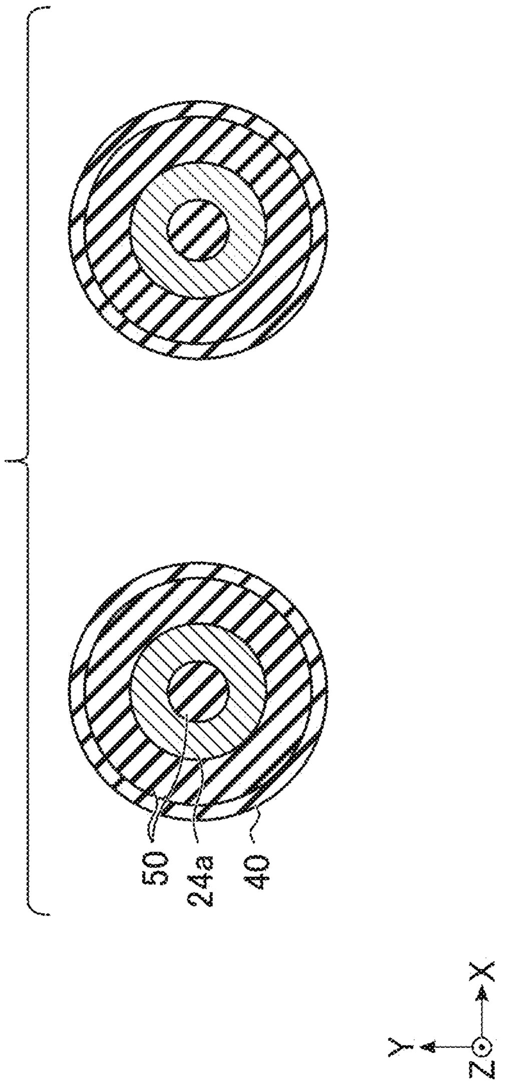
FIG. 16 is a cross-sectional view taken along line XVI-XVI of FIG. 11 and illustrating an example of a cross-sectional structure of the memory cell array used in the storage device according to the first modification.

In the storage device according to the first modification as well, each of the plurality of stacked layer structures includes electrodes 22, 24 and 26 and elements 23 and 25. The configurations of a plurality of conductors 21, a plurality of electrodes 22, a plurality of elements 23, a plurality of electrode portions 24*b*, a plurality of elements 25, a plurality of electrodes 26, and a plurality of conductors 27 are substantially similar to those of the embodiment. The configuration of the electrode portions 24*a* in the storage device according to the first modification will be described below with reference to FIG. 15 and FIG. 16. FIG. 15 is a cross-sectional view showing an example of a cross-sectional structure of a memory cell array used in the storage device according to the first modification. FIG. 16 is a cross-sectional view taken along line XVI-XVI of FIG. 15 and illustrating an example of a cross-sectional structure of the memory cell array used in the storage device according to the first modification.

Each of the plurality of electrode portions 24*a* according to the first modification has, for example, a ring-shaped cross section in the XY plane. The outer diameter of each of the lower faces of the plurality of electrode portions 24*a* is equal to or smaller than the outer diameter of the upper face of the element 23 corresponding to that electrode portion 24*a*. Thus, in the first modification as well, the area of the lower face of each of the plurality of electrode portions 24*a* is smaller than the area of the upper face of the element 23 corresponding to that electrode portion 24*a*. Also, the outer diameter of the upper face of each of the plurality of electrode portions 24*a* is equal to or smaller than the outer diameter of the lower face of the electrode portion 24*b* corresponding to that electrode portion 24*a*. Thus, in the first modification as well, the area of the upper face of each of the plurality of electrode portions 24*a* is smaller than the area of the lower face of the electrode portion 24*b* corresponding to that electrode portion 24*a*.

It should be noted that in the entire region along the Z direction, the outer diameter of each of the plurality of electrode portions 24*a* is, for example, equal to or smaller than the outer diameter of the upper face of the element 23 corresponding to that electrode portion 24*a* and the outer diameter of the lower face of the electrode portion 24*b* corresponding to that electrode portion 24*a*.

An insulator 50 is provided on the upper face of each of the plurality of elements 23 such that the insulator 50 is in the same layer as the electrode portion 24*a*. The insulator 50 includes, for example, silicon oxide and silicon nitride. As shown in FIG. 16, the insulator 50 is provided, for example, on the upper face of each of the plurality of elements 23 such that the insulator 50 fills the periphery and inner region of the ring-shaped electrode portion 24*a* in the XY plane.

2.1.2 Manufacturing Method

Next, a description will be given of a method for manufacturing the memory cell array 10 used in the storage device 1 according to the first modification.

Figure 17:
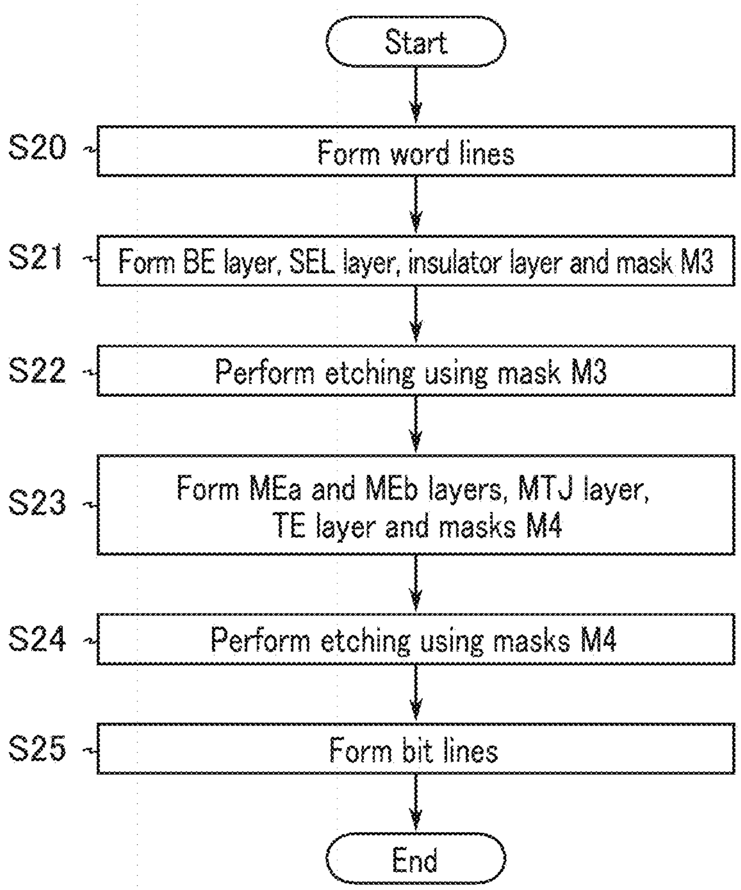
FIG. 17 is a flowchart for illustrating a method for manufacturing the memory cell array used in the storage device according to the first modification.

FIG. 17 is a flowchart for illustrating the method for manufacturing the memory cell array used in the storage device according to the first modification. FIG. 18 and FIG. 20 through FIG. 22 are cross-sectional views for illustrating the method for manufacturing the memory cell array used in the storage device according to the first modification. FIG. 19 is a top view for illustrating the method for manufacturing the memory cell array used in the storage device according to the first modification. FIG. 18 and FIG. 20 through FIG. 22 are cross-sectional views corresponding to FIG. 15.

The process in S20 is similar to the process in S0.

Figure 18:
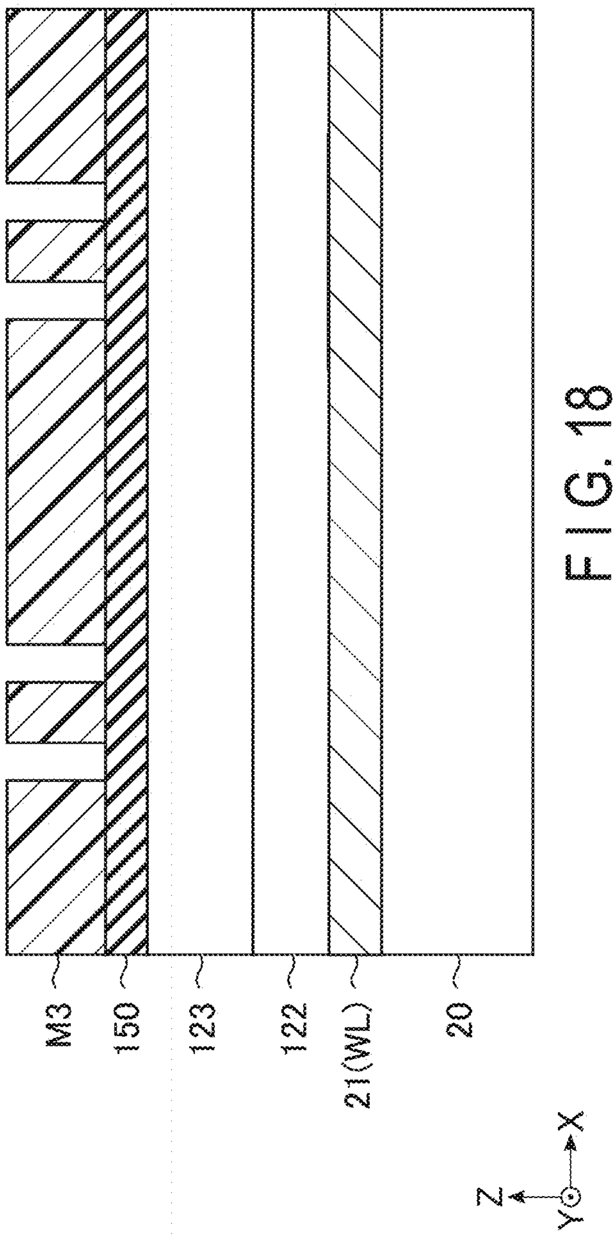
FIG. 18 is a cross-sectional view for illustrating a method for manufacturing the memory cell array used in the storage device according to the first modification.
Figure 19:
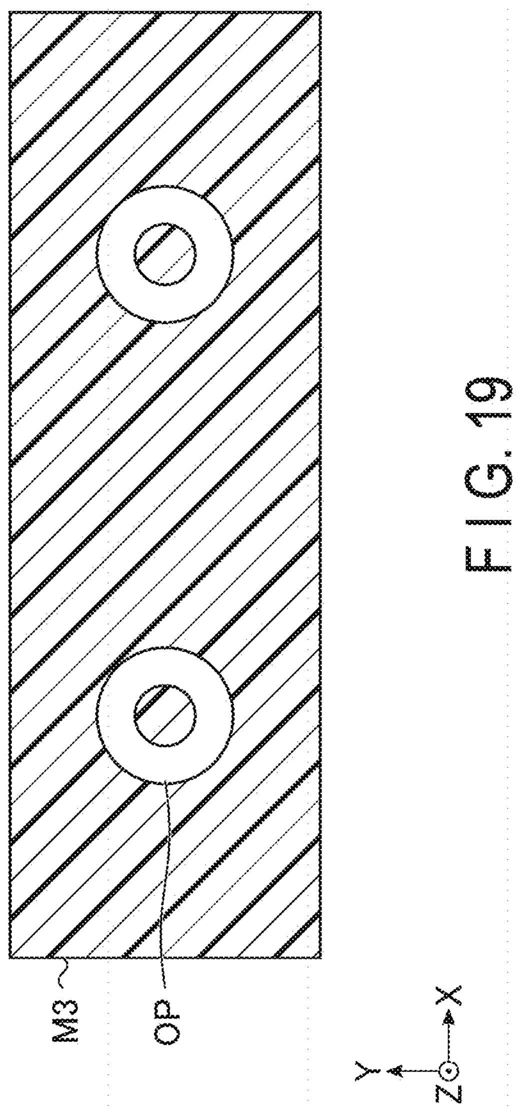
FIG. 19 is a top view for illustrating a method for manufacturing the memory cell array used in the storage device according to the first modification.

In S21, as shown in FIG. 18, an electrode layer 122, a switching element layer 123, an insulator layer 150, and a mask M3 are formed in this order on the upper faces of a plurality of conductors 21 and an insulator (not shown). As shown in FIG. 19, the mask M3 is formed by photolithography or the like and has an opening in a region OP corresponding to the electrode portion 24*a* when viewed from above. The mask M3 includes titanium nitride (TiN), for example, and protects the insulator layer 150 except for the region corresponding to the electrode portion 24*a* during ion beam etching described later.

Figure 20:
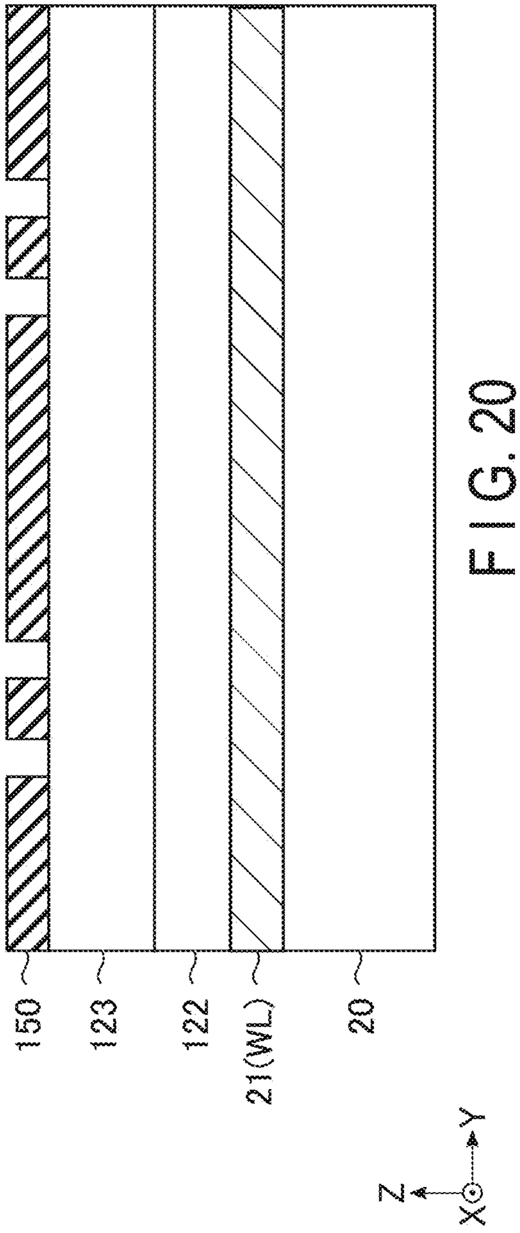
FIG. 20 is a cross-sectional view for illustrating a method for manufacturing the memory cell array used in the storage device according to the first modification.

Next, in S22, the insulator layer 150 is etched by ion beam etching. The mask M3 is removed. By the above process, as shown in FIG. 20, the portion of the insulator layer 150 not protected by the mask M3 is removed and a hole is formed that exposes the switching element layer 123 located below that portion.

Figure 21:
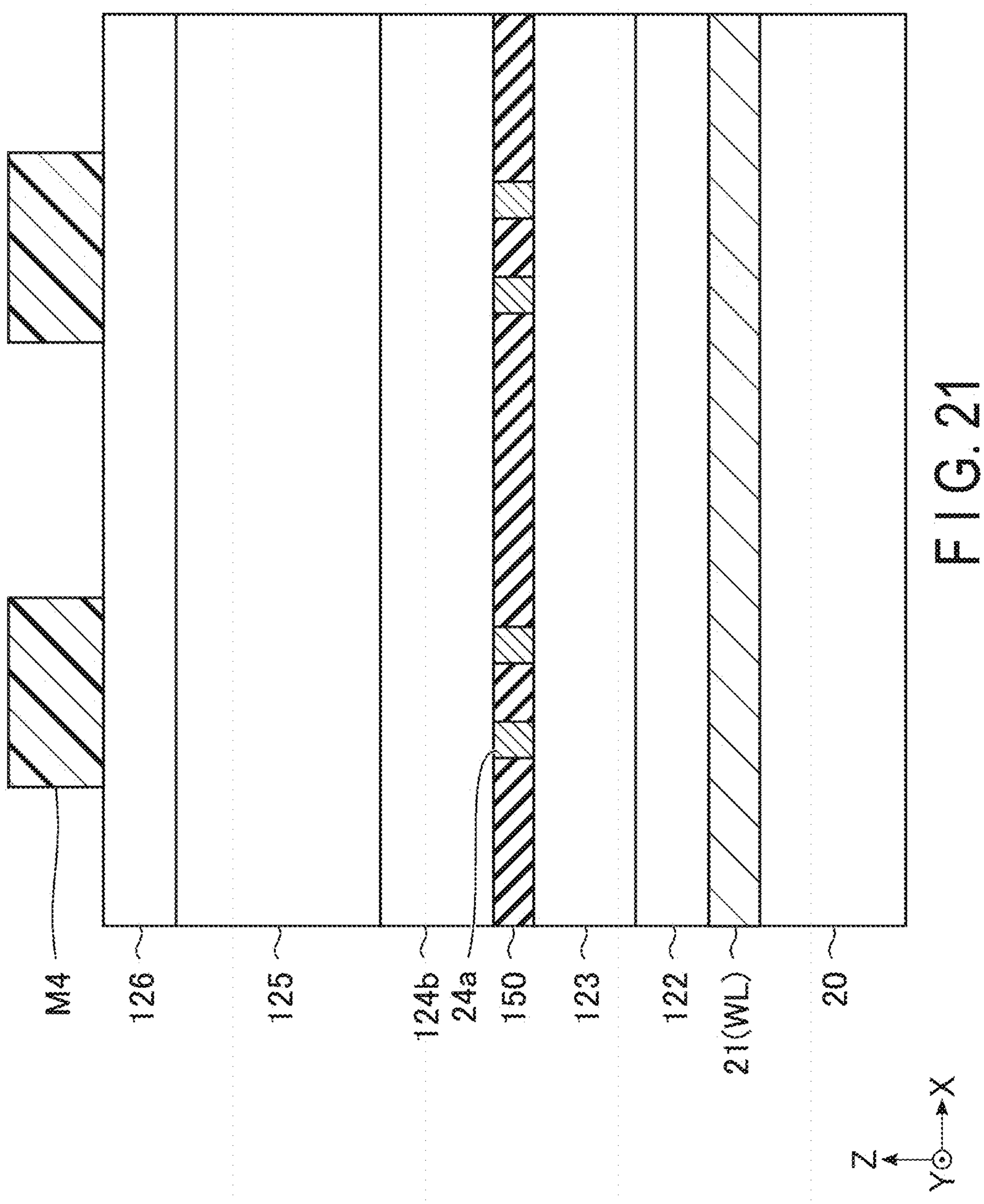
FIG. 21 is a cross-sectional view for illustrating a method for manufacturing the memory cell array used in the storage device according to the first modification.

Then, in S23, as shown in FIG. 21, an electrode portion 24*a*, an electrode layer 124*b*, a magnetoresistance effect element layer 125, an electrode layer 126, and a plurality of masks M4 are formed in this order. More specifically, the electrode portion 24*a* is formed in the hole formed in S22, using, for example, ALD (atomic layer deposition), CVD (chemical vapor deposition), etc. and CMP (chemical mechanical polishing). In addition, an electrode layer 124*b*, a magnetoresistance effect element layer 125, an electrode layer 126, and a plurality of masks M4 are formed in this order on the upper face of the electrode portion 24*a* and the insulator layer 150. The plurality of masks M4 are formed in a manner similar to that of the plurality of masks M1 formed in S1 of the embodiment.

Figure 22:
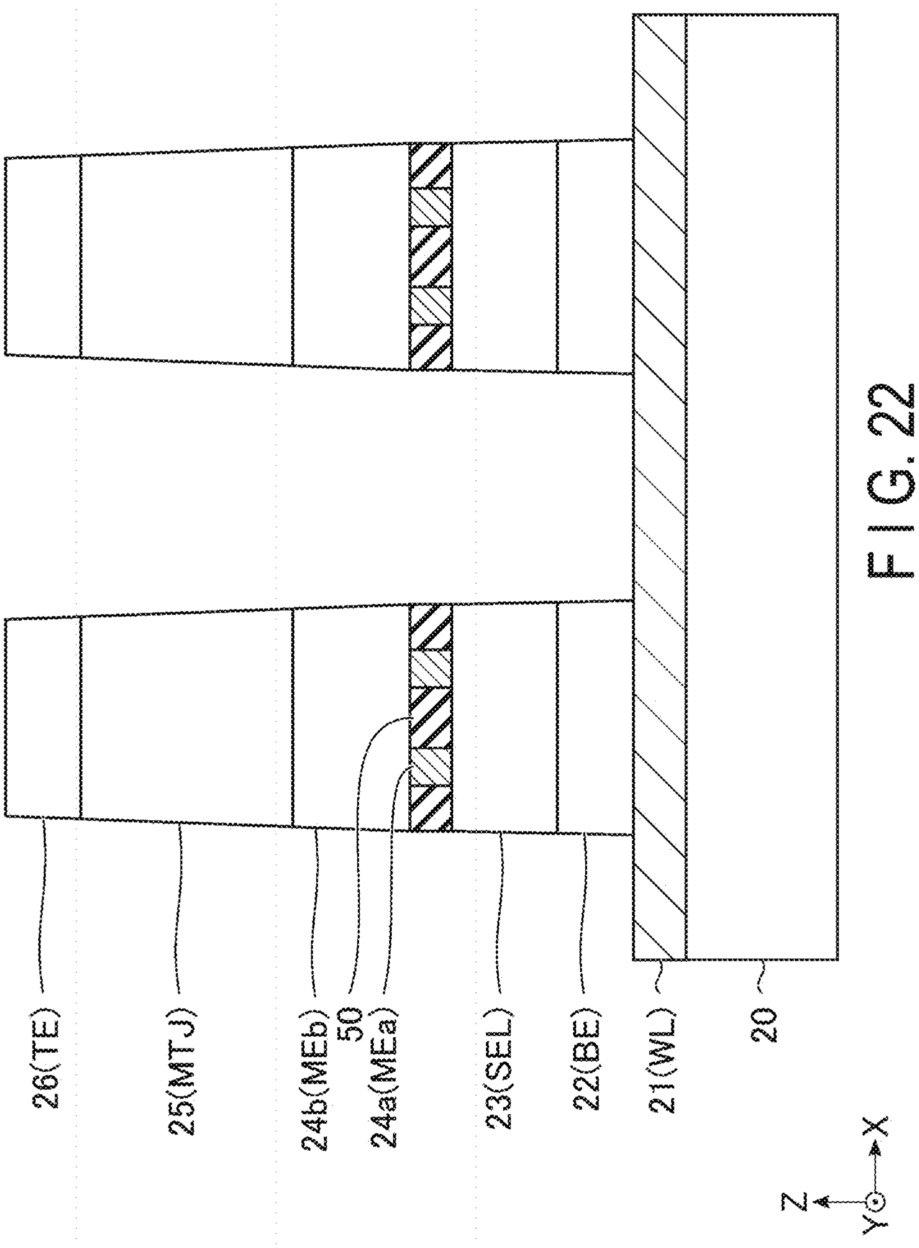
FIG. 22 is a cross-sectional view for illustrating a method for manufacturing the memory cell array used in the storage device according to the first modification.

The process in S24 is similar to the process in S2 of the embodiment, except that the plurality of masks M4 are used in place of the plurality of masks M1. By the process in S24, a plurality of stacked layer structures, each including electrodes 22, 24 and 26 and elements 23 and 25, are formed, as shown in FIG. 22, from the electrode layer 122, the switching element layer 123, the electrode portion 24*a*, the insulator layer 150, the magnetoresistance effect element layer 125, and the electrode layer 126.

In the process in S25, a sidewall insulator 40 and a plurality of conductors 27 are formed in a similar manner to that of the process in S4 of the embodiment.

In this manner, the storage device 1 according to the first modification is manufactured.

According to the first modification as well, similar advantages to those of the embodiment can be obtained.

2.2 Second Modification

In connection with the embodiment and first modification described above, reference was made to the case where the electrode portion 24*b* is provided on the upper face of the electrode portion 24*a*; however, this is not restrictive. The electrode portion 24*a* may be provided on the upper face of the electrode portion 24*b*.

Figure 23:
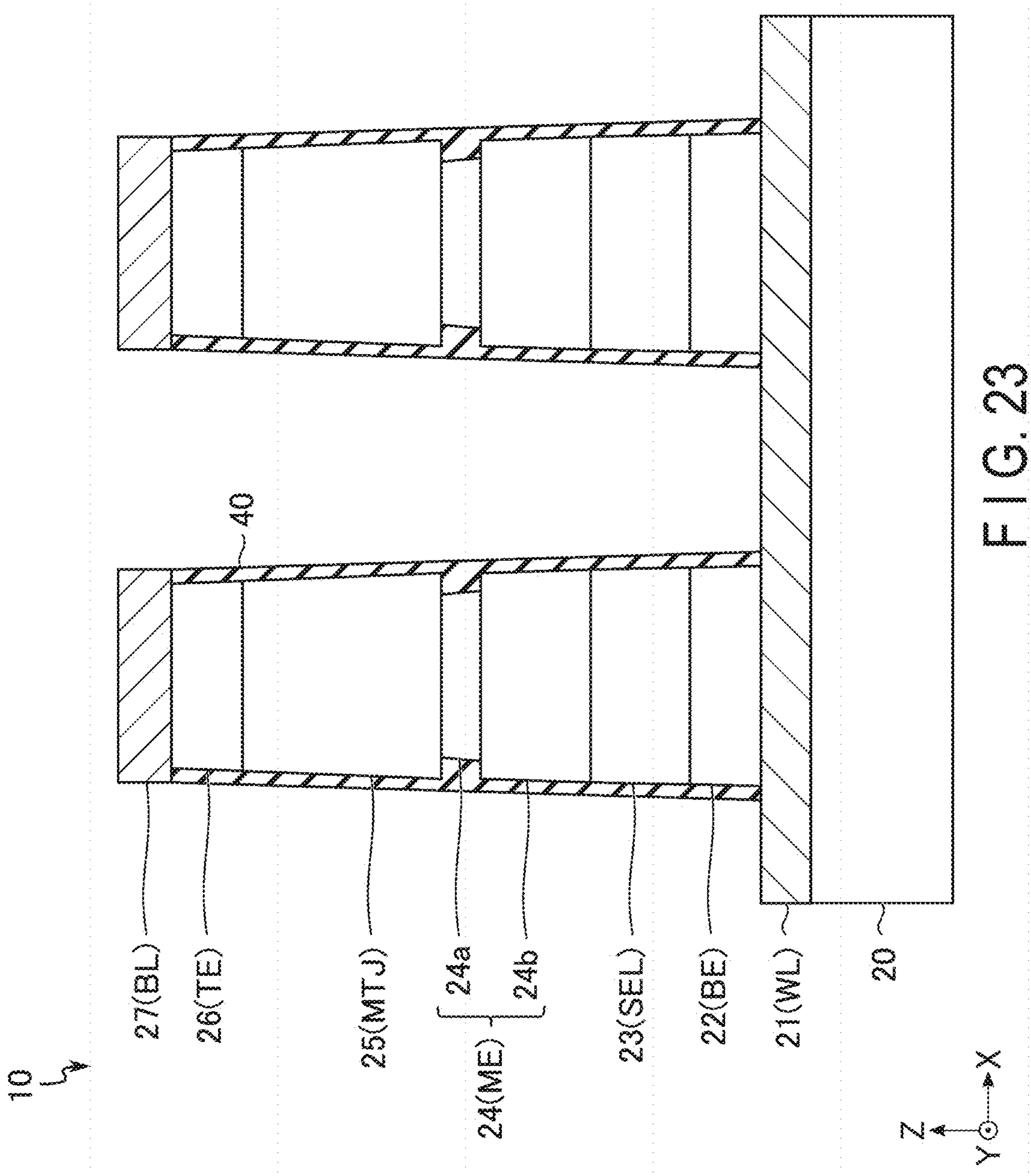
FIG. 23 is a cross-sectional view showing an example of a cross-sectional structure of a memory cell array used in a storage device according to a second modification.

In the storage device according to the second modification, the configurations of a plurality of conductors 21, a plurality of electrodes 22, a plurality of elements 23, a plurality of elements 25, a plurality of electrodes 26, and a plurality of conductors 27 are substantially similar to those of the embodiment and the first modification. The configuration of an intermediate electrode ME used in the storage device according to the second modification will be described below with reference to FIG. 23. FIG. 23 is a cross-sectional view showing an example of a cross-sectional structure of a memory cell array used in the storage device according to the second modification. In the description below, the storage device 1 according to the second modification includes an electrode portion 24*a* having a circular cross section in the XY plane, as in the embodiment; however, this is not restrictive. The storage device 1 according to the second modification may include an electrode portion 24*a* having a ring-shaped cross section in the XY plane, as in the first modification.

In the second modification, each of a plurality of electrode portions 24*b* is provided on the upper face of a corresponding one element 23 of the plurality of elements 23.

On the upper face of each of the plurality of electrode portions 24*b*, a corresponding one electrode portion 24*a* of a plurality of electrode portions 24*a* is provided. The outer diameter of the lower face of each of the electrode portions 24*a* is smaller than the outer diameter of the upper face of the electrode portion 24*b* corresponding to that electrode portion 24*a*. As a result, the area of the lower face of each of the plurality of electrode portions 24*a* is smaller than the area of the upper face of the electrode portion 24*b* corresponding to that electrode portion 24*a*.

A corresponding one element 25 of the plurality of elements 25 is provided on the upper face of each of the plurality of electrode portions 24*a*. The outer diameter of the upper face of each of the electrode portions 24*a* is smaller than the outer diameter of the lower face of the element 25 corresponding to that electrode portion 24*a*. As a result, the area of the upper face of each of the electrode portions 24*a* is smaller than the area of the lower face of the element 25 corresponding to that electrode portion 24*a*.

It should be noted that in the entire region along the Z direction, the outer diameter of each of the plurality of electrode portions 24*a* is smaller, for example, than the outer diameter of the upper face of the electrode portion 24*b* corresponding to that electrode portion 24*a* and the outer diameter of the lower face of the element 25 corresponding to that electrode portion 24*a*.

In a case where the electrode portion 24*a* has a ring-shaped cross section, the outer diameter of the lower face of each of the plurality of electrode portions 24*a* is equal to or smaller than the outer diameter of the upper face of the electrode portion 24*b* corresponding to that electrode portion 24*a*. The outer diameter of the upper face of each of the plurality of electrode portions 24*a* is equal to or smaller than the outer diameter of the lower face of the element 25 corresponding to that electrode portion 24*a*.

The manufacturing method of the storage device 1 according to the second modification can be made similar to the manufacturing method of the embodiment, for example, except for the order in which the electrode layers 124*a* and 124*b* are formed.

Furthermore, as in the first modification, in a case where the storage device 1 according to the second modification includes an electrode portion 24*a* having a ring-shaped cross section in the XY plane, the manufacturing method can made similar to the manufacturing method of the storage device 1 according to the first modification, except that the electrode layer 124*b* is formed before the electrode portion 24*a* is formed using the insulator layer 150 and the mask M2.

The storage device according to the second modification also provides similar advantages to those of the embodiment and the first modification.

2.3 Third Modification

In connection with the embodiment, first modification, and second modification described above, reference was made to the case where the intermediate electrode ME is composed of the electrode portions 24*a* and 24*b*; however, this is not restrictive. The intermediate electrode ME may further include different configurations in addition to the electrode portions 24*a* and 24*b*.

Figure 24:
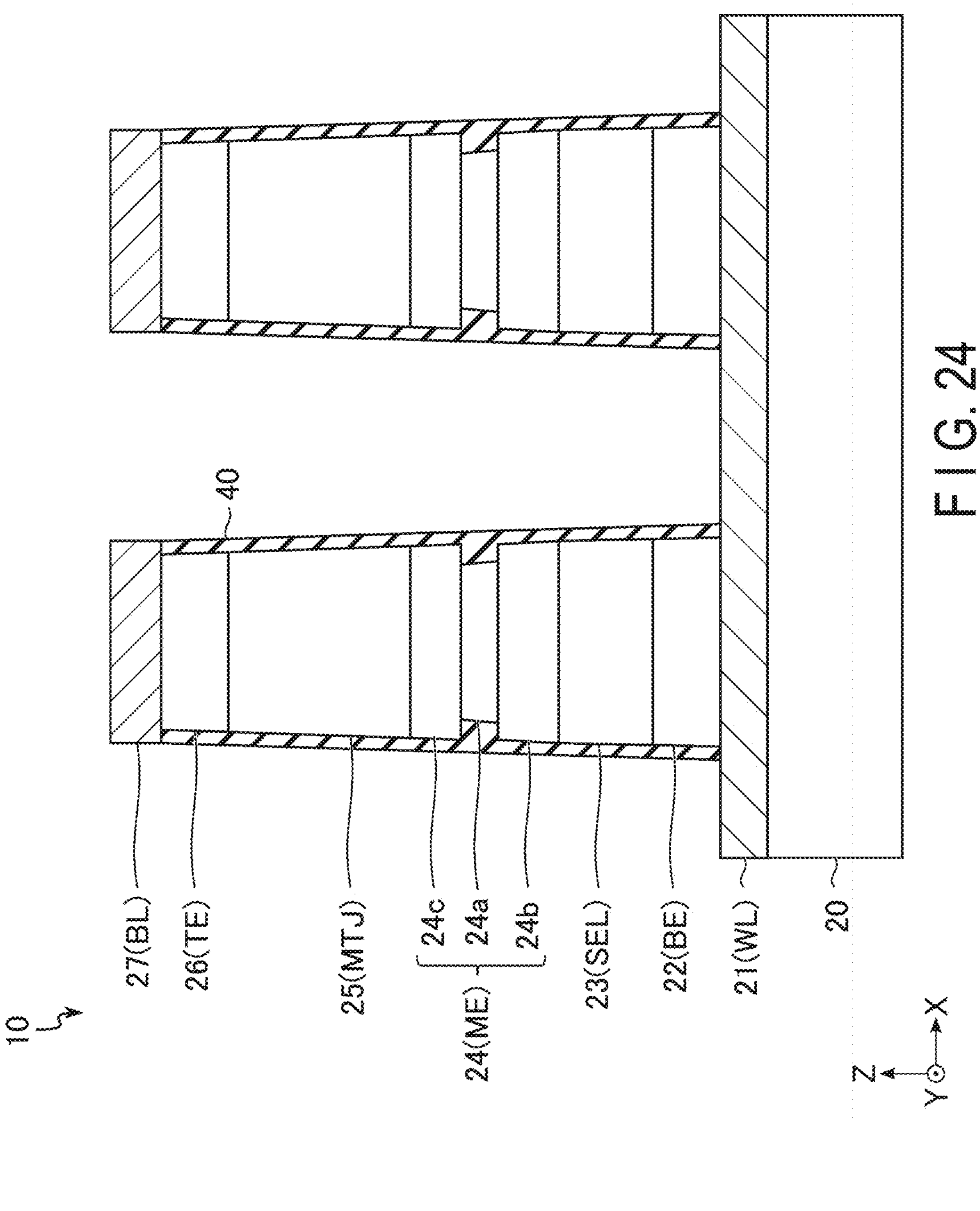
FIG. 24 is a cross-sectional view showing an example of a cross-sectional structure of a memory cell array used in a storage device according to a third modification.

In the storage device according to the third modification, the configurations of a plurality of conductors 21, a plurality of electrodes 22, a plurality of elements 23, a plurality of elements 25, a plurality of electrodes 26, and a plurality of conductors 27 are substantially similar to those of the embodiment, the first modification and the second modification. The configuration of an intermediate electrode ME used in the storage device according to the third modification will be described below with reference to FIG. 24. FIG. 24 is a cross-sectional view showing an example of a cross-sectional structure of a memory cell array used in the storage device according to the third modification. In what follows, a description will be given of the case where the storage device 1 according to the third modification includes an electrode portion 24*a* having a circular cross section in the XY plane, as in the embodiment; however, this is not restrictive. The storage device 1 according to the third modification may include an electrode portion 24*a* having a ring-shaped cross section in the XY plane, as in the first modification.

In the third modification, the intermediate electrode ME includes an electrode portion 24*c* in addition to electrode portions 24*a* and 24*b*. The configurations of the electrode portions 24*a* and 24*b* according to the third modification are substantially similar to the those of the electrode portions 24*a* and 24*b* according to the embodiment and the first modification.

On the upper face of each of a plurality of electrode portions 24*a*, a corresponding one electrode portion 24*c* of the plurality of electrode portions 24*c* is provided. Like the electrode portions 24*a* and 24*b*, the electrode portion 24*c* has a circular cross section in the XY plane. The outer diameter of the lower face of each of the plurality of electrode portions 24*c* is larger than the outer diameter of the upper face of the electrode portion 24*a* corresponding to that electrode portion 24*c*. Thus, the area of the lower face of each of the plurality of electrode portions 24*c* is larger than the area of the upper face of the electrode portion 24*a* corresponding to that electrode portion 24*c*. It should be noted that in the entire region along the Z direction, the outer diameter of each of the plurality of electrode portions 24*a* is smaller, for example, than the outer diameter of the lower face of the electrode portion 24*c* corresponding to that electrode portion 24*a* and the outer diameter of the upper face of the electrode portion 24*b* corresponding to that electrode portion 24*a*. The electrode portion 24*c* includes, for example, titanium (Ti), tungsten (W), titanium nitride (TiN), tungsten nitride (WN), titanium nitride (TiWN) containing tungsten, etc.

In a case where the electrode portion 24*a* has a ring-shaped cross section, the outer diameter of the upper face of each of the plurality of electrode portions 24*a* is equal to or smaller than the outer diameter of the lower face of the electrode portion 24*c* corresponding to that electrode portion 24*a*.

A corresponding one element 25 of the plurality of elements 25 is provided on the upper face of each of the plurality of electrode portions 24*c*.

The manufacturing method of the storage device 1 according to the third modification can be made similar to the manufacturing method of the embodiment, for example, except that in S1 or S11 an electrode layer corresponding to the electrode portion 24*c* is formed in addition to the electrode layers 124*a* and 124*b*.

Furthermore, as in the first modification, in a case where the storage device 1 according to the second modification includes an electrode portion 24*a* having a ring-shaped cross section in the XY plane, the manufacturing method can be made similar to the manufacturing method of the storage device 1 according to the first modification, except that an electrode layer corresponding to the electrode portion 24*c* is formed in S23.

The storage device according to the third modification also provides similar advantages to those of the embodiment, the first modification, and the second modification.

2.4 Fourth Modification

In connection with the embodiment, first modification, second modification, and third modification described above, reference was made to the case where the intermediate electrode ME is composed of a plurality of electrode portions; however, this is not restrictive. The intermediate electrode ME may be composed only of a configuration corresponding to an electrode portion 24*a*.

Figure 25:
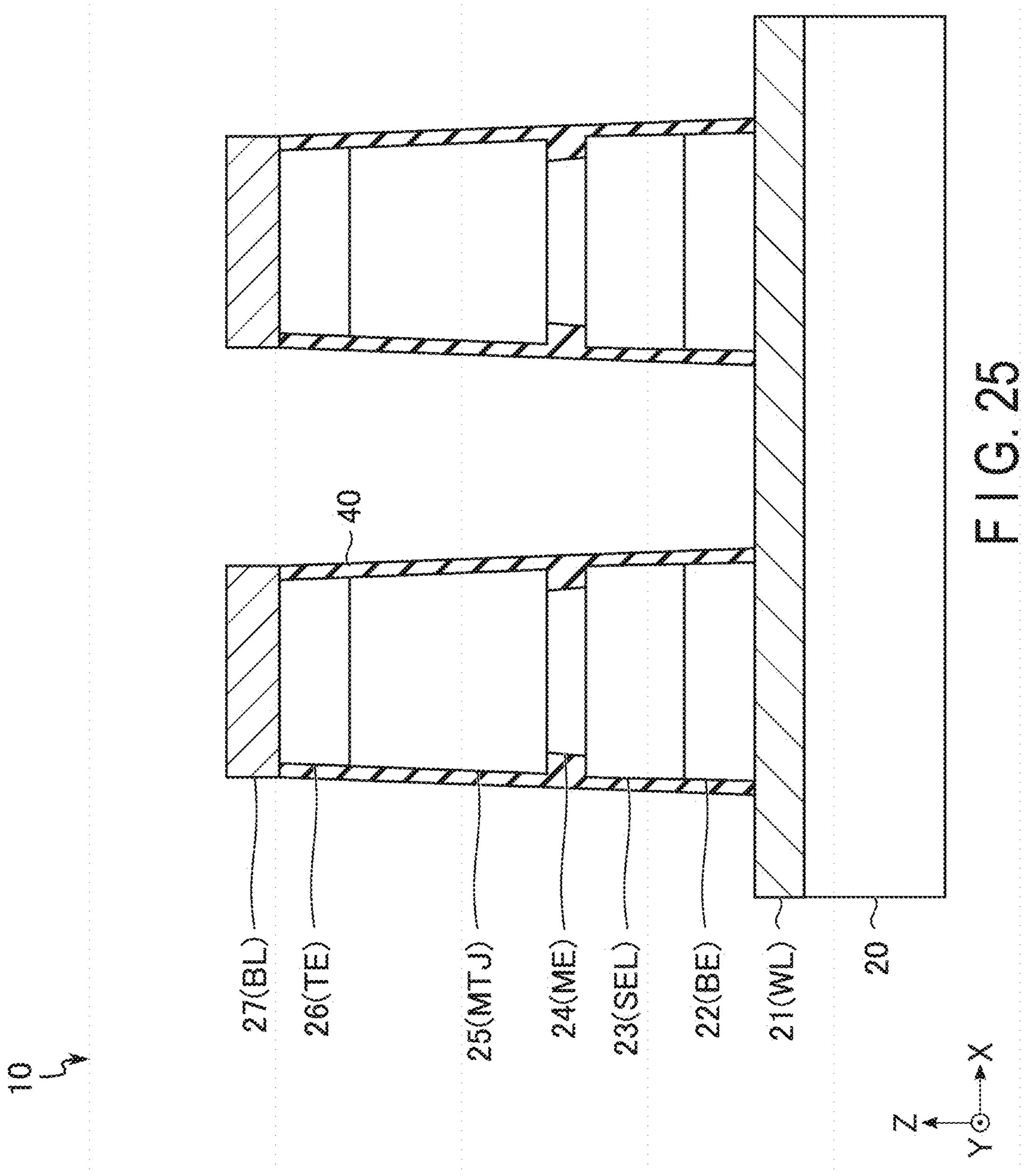
FIG. 25 is a cross-sectional view showing an example of a cross-sectional structure of a memory cell array used in a storage device according to a fourth modification.

The storage device 1 according to the fourth modification includes a plurality of conductors 21, a plurality of electrodes 22, a plurality of elements 23, a plurality of electrodes 24, a plurality of elements 25, a plurality of electrodes 26, and a plurality of conductors 27. In the storage device 1 according to the fourth modification, the configurations of the plurality of conductors 21, the plurality of electrodes 22, the plurality of elements 23, the plurality of elements 25, the plurality of electrodes 26, and the plurality of conductors 27 are substantially similar to those of the embodiment, the first modification, the second modification, and the third modification. In what follows, a description will be given with reference to FIG. 25 of the configuration of the plurality of electrodes 24 used in the storage device according to the fourth modification. FIG. 25 is a cross-sectional view showing an example of a cross-sectional structure of a memory cell array used in the storage device according to the fourth modification. In what follows, a description will be given of the case where the storage device 1 according to the fourth modification includes an electrode 24 having a circular cross section in the XY plane, like the electrode portion 24*a* of the embodiment; however, this is not restrictive. The storage device 1 according to the fourth modification may include an electrode 24 having a ring-shaped cross section in the XY plane, like the electrode portion 24*a* of the first modification.

In the fourth modification, each of the plurality of electrodes 24 is provided on the upper face of a corresponding one element 23 of the plurality of elements 23. On the upper face of each of the plurality of electrodes 24, a corresponding one element 25 of the plurality of elements 25 is provided. Thus, in the fourth modification, the intermediate electrode ME is made only of the electrode 24. The outer diameter of the lower face of each of the plurality of electrodes 24 is smaller than the outer diameter of the upper face of the element 23 corresponding to that electrode 24. As a result, the area of the lower face of each of the plurality of electrodes 24 is smaller than the area of the upper face of the element 23 corresponding to that electrode 24. In addition, the outer diameter of the upper face of each of the plurality of electrodes 24 is smaller than the outer diameter of the lower face of the element 25 corresponding to that electrode 24. As a result, the area of the upper face of each of the plurality of electrodes 24 is smaller than the area of the lower face of the element 25 corresponding to that electrode 24.

For example, in the entire region along the Z direction, the outer diameter of each of the plurality of electrodes 24 is smaller than the outer diameter of the upper face of the element 23 corresponding to that electrode 24 and the outer diameter of the lower face of the element 25 corresponding to that electrode 24.

In a case where the plurality of electrodes 24 each have a ring-shaped cross section, the outer diameter of the lower face of each of the plurality of electrodes 24 is equal to or smaller than the outer diameter of the upper face of the element 23 corresponding to that electrode 24. The outer diameter of the upper face of each of the plurality of electrodes 24 is equal to or smaller than the outer diameter of the lower face of the element 25 corresponding to that electrode 24.

The manufacturing method of the storage device 1 according to the fourth modification can be made similar to the manufacturing method of the embodiment, except that the electrode layer **124*b*** is not formed, for example.

Furthermore, in a case where the storage device 1 according to the fourth modification includes an electrode 24 having a ring-shaped cross section in the XY plane, as in the first modification, the manufacturing method can be made similar to the manufacturing method of the storage device 1 according to the first modification, except that the electrode layer **124*b*** is not formed.

The storage device according to the fourth modification also provides similar advantages to those of the embodiment, the first modification, the second modification, and the third modification.

2.5 Fifth Modification

In the embodiment, first modification, second modification, third modification, and fourth modification described above, the face of the intermediate electrode ME or the face of a portion thereof on the switching element SEL side is in contact with a larger-area face in the stacked layer structure; however, this is not restrictive. The face of the lower electrode BE or the face of a portion thereof on the switching element SEL side may be in contact with a larger-area face in the stacked layer structure.

The configuration and manufacturing method of the storage device according to the fifth modification will be described below.

Figure 26:
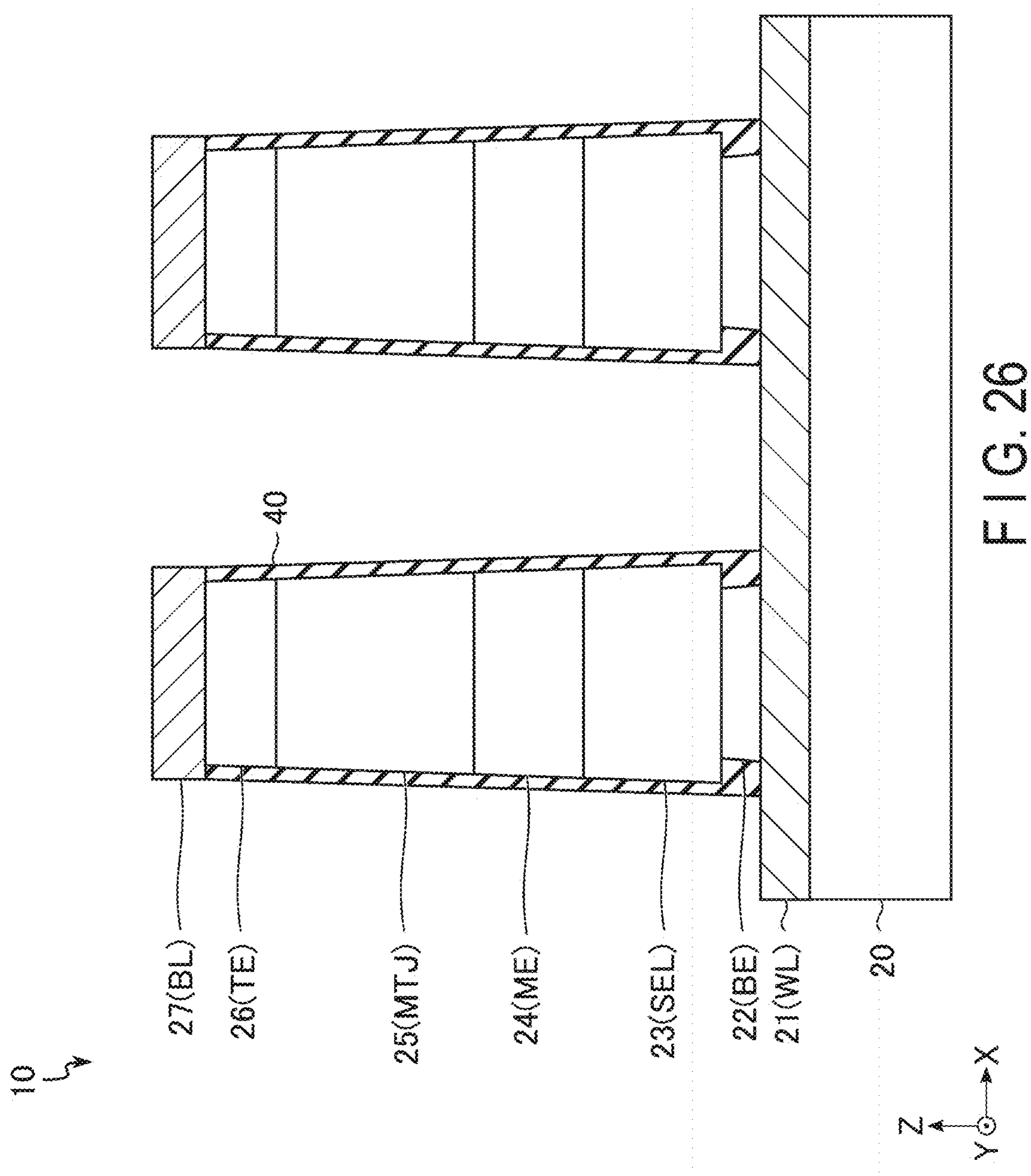
FIG. 26 is a cross-sectional view showing an example of a cross-sectional structure of a memory cell array used in a storage device according to a fifth modification.

In the fifth modification, the memory cell array 10 includes a plurality of conductors 21, a plurality of electrodes 22, a plurality of elements 23, a plurality of electrodes 24, a plurality of elements 25, a plurality of electrodes 26, and a plurality of conductors 27. In the fifth modification, the configurations of the plurality of conductors 21, the plurality of elements 23, the plurality of elements 25, the plurality of electrodes 26, and the plurality of conductors 27 are substantially similar to those of the embodiment, the first modification, the second modification, the third modification and the fourth modification. In what follows, a description will be given with reference to FIG. 26 of the configuration of the plurality of electrodes 22 and 24 used in the storage device 1 according to the fifth modification. FIG. 26 is a cross-sectional view showing an example of a cross-sectional structure of the memory cell array used in the storage device according to the fifth modification.

On the upper face of each of the plurality of electrodes 22, a corresponding one element 23 of the plurality of elements 23 is provided. Each of the plurality of electrodes 22 has, for example, a circular shape. The outer diameter of the upper face of each of the plurality of electrodes 22 is smaller than the outer diameter of the lower face of the element 23 corresponding to that electrode 22. As a result, the area of the upper face of each of the plurality of electrodes 22 is smaller than the area of the lower face of the element 23 corresponding to that electrode 22. It should be noted that in the entire region along the Z direction, the outer diameter of each of the plurality of electrodes 22 is smaller than the outer diameter of the lower face of the element 23 corresponding to that electrode 22. The electrode 22 includes carbon (C), for example. The electrode 22 may have an amorphous structure.

Although FIG. 26 shows a case in which the electrode 22 has a circular shape when viewed from above, like the electrode portion **24*a* of the embodiment, this is not restrictive. The electrode 22 may have a ring-shape when viewed from above, like the electrode portion 24*a* of the first modification. In this case, the outer diameter of the upper face of each of the plurality of electrodes 22 is equal to or smaller than the outer diameter of the lower face of the element 23 corresponding to that electrode 22**.

On the upper face of each of the plurality of elements 23, a corresponding one electrode 24 of the plurality of electrodes 24 is provided. The electrode 24 includes, for example, titanium (Ti), tungsten (W), titanium nitride (TiN), tungsten nitride (WN), titanium nitride (TiWN) containing tungsten, etc. Although not shown, the electrode 24 can be composed of one or more portions.

The storage device 1 according to the fifth modification as described above can be manufactured in a similar manner to the manufacturing method according to the embodiment, except that the electrode layer 124 is formed instead of the electrode layers **124*a* and 124*b*, and that the electrode 22 is partially etched instead of the electrode portion 24*a* partially etched in S3 or S13** of the embodiment.

In addition, in a case where the storage device 1 according to the fifth modification includes an electrode 22 having a ring-shaped cross section in the XY plane, like the electrode portion **24*a* of the first modification, the plurality of electrodes 22 can be formed on the upper faces of the plurality of conductors 21 similarly to the electrode portion 24*a* that is formed in the first modification using the insulator layer 150 and the mask M2**.

The fifth modification also provides similar advantages to those of the embodiment, the first modification, the second modification, the third modification and the fourth modification.

Although FIG. 26 shows a case in which the lower electrode BE is composed of one portion, this is not restrictive. In the fifth modification, a plurality of electrode portions can be stacked as the lower electrode BE. In this case, the lower electrode BE is configured such that the area of the face (upper face) of one electrode portion (first electrode portion) of the plurality of electrode portions, the face being on the side of the switching element SEL, is in contact with a larger-area face in the stacked layer structure. More specifically, like the intermediate electrodes ME according to the embodiment and the first modification, the lower electrode BE may be composed of a plurality of electrode portions, and the first electrode portion may be in contact with the switching element SEL. Like the intermediate electrodes ME according to the second modification and the third modification, the lower electrode BE may be composed of a plurality of electrode portions, and the first electrode portion may be in contact with the switching element SEL via a second electrode portion included in the lower electrode BE and different from the first electrode portion. In the lower electrode BE according to the fifth modification, a third electrode portion different from the first electrode portion and the second electrode portion may be provided between the first electrode portion and the conductor 21, as in the third modification.

2.6 Sixth Modification

In connection with the embodiment, first modification, second modification, third modification and fourth modification described above, a description was given of the case where the face of the intermediate electrode ME or the face of a portion thereof on the switching element SEL side is in contact with a larger-area face in the stacked layer structure, and in connection with the fifth modification, a description was given of the case where the face of the lower electrode BE or the face of a portion thereof on the switching element SEL side is in contact with a larger-area face in the stacked layer structure. However, this is not restrictive. The upper electrode TE and the switching element SEL may be in contact with each other, and the face of the upper electrode TE or the face of a portion thereof on the switching element SEL side may be in contact with a larger-area face in the stacked layer structure.

The configuration and manufacturing method of the storage device according to the sixth modification will be described below.

Figure 27:
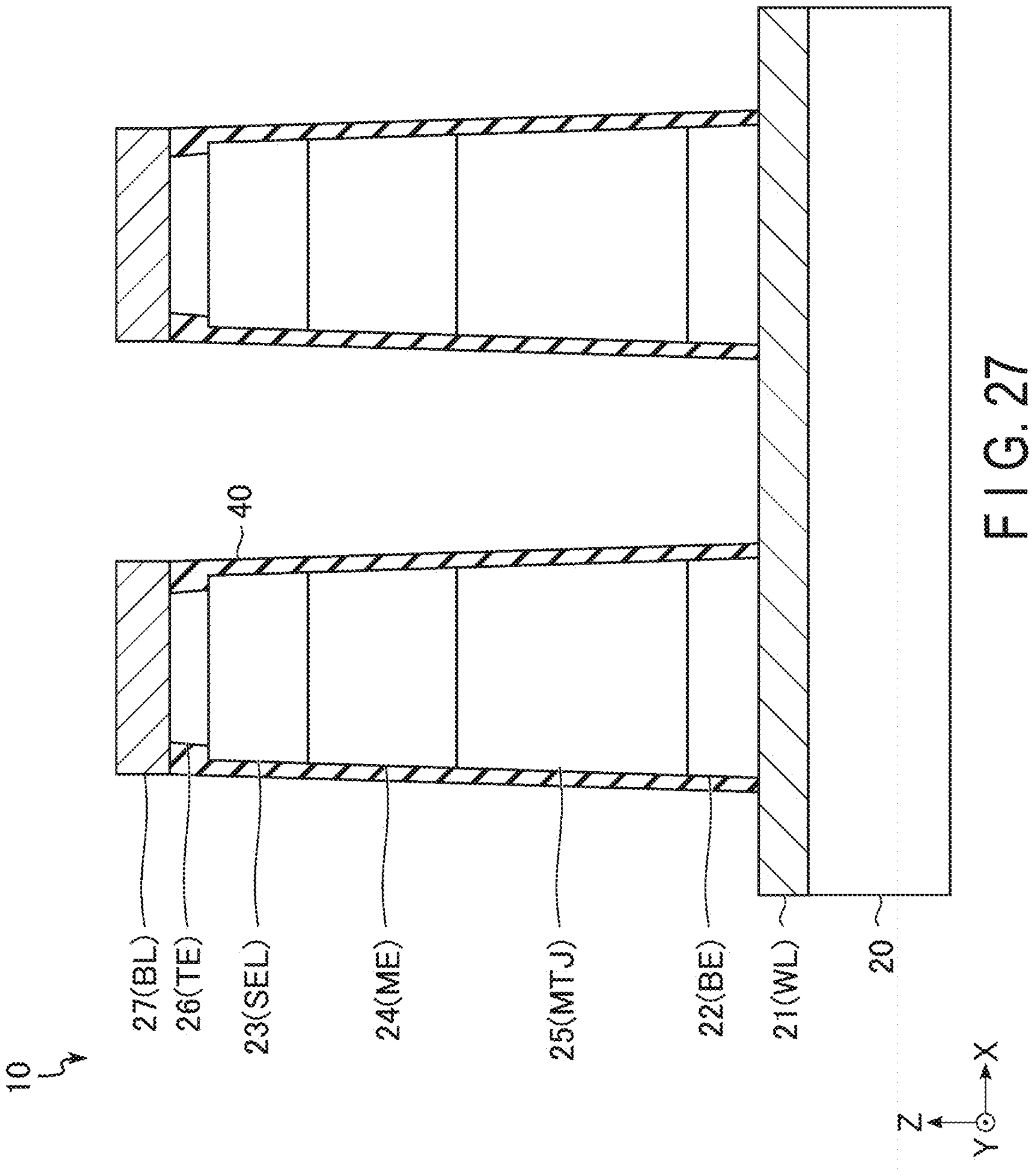
FIG. 27 is a cross-sectional view showing an example of a cross-sectional structure of a memory cell array used in a storage device according to a sixth modification.

In the sixth modification, the memory cell array 10 includes a plurality of conductors 21, a plurality of electrodes 22, a plurality of elements 23, a plurality of electrodes 24, a plurality of elements 25, a plurality of electrodes 26, and a plurality of conductors 27. In the sixth modification, the configurations of the plurality of conductors 21, the plurality of electrodes 22, and the plurality of conductors 27 are substantially similar to those of the embodiment, the first modification, the second modification, and the third modification. In what follows, a description will be given with reference to FIG. 27 of the configurations of the plurality of elements 23, the plurality of electrodes 24, the plurality of elements 25 and the plurality of electrodes 26 that are used in the storage device 1 according to the sixth modification. FIG. 27 is a cross-sectional view showing an example of a cross-sectional structure of the memory cell array used in the storage device according to the sixth modification.

In the sixth modification, on the upper faces of each of the plurality of electrodes 22, a corresponding one element 25 of the plurality of elements 25 is provided.

On the upper face of each of the plurality of elements 25, a corresponding one electrode 24 of the plurality of electrodes 24 is provided. For example, the configuration of the electrode 24 is similar to the configuration of the electrode 24 of the fifth modification.

On the upper face of each of the plurality of electrodes 24, a corresponding one element 23 of the plurality of elements 23 is provided.

On the upper face of each of the plurality of elements 23, a corresponding one electrode 26 of the plurality of electrodes 26 is provided. The outer diameter of the lower face of each of the plurality of electrodes 26 is smaller than the outer diameter of the upper face of the element 23 corresponding to that electrode 26. As a result, the area of the lower face of each of the plurality of electrodes 26 is smaller than the area of the upper face of the element 23 corresponding to that electrode 26. It should be noted that in the entire region along the Z direction, the outer diameter of each of the plurality of electrodes 26 is smaller than the outer diameter of the upper face of the element 23 corresponding to that electrode 26. The electrode 26 includes carbon (C), for example. The electrode 26 may have an amorphous structure.

Although FIG. 27 shows a case in which the electrode 26 has a circular shape when viewed from above, like the electrode portion 24*a* of the embodiment, this is not restrictive. The electrode 26 may have a ring-shape when viewed from above, like the electrode portion 24*a* of the first modification. In this case, the outer diameter of the lower face of each of the plurality of electrodes 26 is equal to or smaller than the outer diameter of the upper face of the element 23 corresponding to that electrode 26.

The storage device 1 according to the sixth modification as described above can be manufactured in a similar manner to that of the first manufacturing method according to the embodiment, except that the electrode layer 124 is formed instead of the electrode layers 124*a* and 124*b*, that the stacking order is different, and that, in S3 of the embodiment, the electrode 26 is partially etched instead of the electrode portion 24*a* being partially etched. The storage device 1 according to the sixth modification can be formed in a similar manner to that of the second manufacturing method of the embodiment, except that the electrode 26 is partially etched after the process in S14 and before the process in S15, instead of the process in S13.

In a case where the storage device 1 according to the sixth modification includes an electrode 26 having a ring-shaped cross section in the XY plane, like the electrode portion 24*a* of the first modification, an electrode layer 124 and a magnetoresistance effect element layer 125 are formed, for example, in a process corresponding to S21. A mask corresponding to the mask M3 is formed on the upper face of the magnetoresistance effect element layer 125. In S22 and S23, an electrode 26 may be formed on the upper face of the switching element layer 123 in a similar manner to that of the electrode portion 24*a* formed in the first modification using the mask M3. It should be noted that the stacking order of the plurality of electrode layers and element layers is different from that in the first modification.

The sixth modification also provides similar advantages to those of the embodiment, the first modification, the second modification, the third modification, the fourth modification, and the fifth modification.

Although FIG. 27 shows a case in which the upper electrode TE is composed of one portion, this is not restrictive. In the sixth modification, a plurality of electrode portions can be stacked as the upper electrode TE. In this case, the upper electrode TE is configured such that the face (lower face) of one electrode portion (first electrode portion) of the plurality of electrode portions, the face being on the side of the switching element SEL, is in contact with a larger-area face in the stacked layer structure. More specifically, like the intermediate electrodes ME according to the embodiment and the first modification, the upper electrode TE may be composed of a plurality of electrode portions, and the first electrode portion may be in contact with the switching element SEL. Like the intermediate electrodes ME according to the second and third modifications, the upper electrode TE may be composed of a plurality of electrode portions, and the first electrode portion may be in contact with the switching element SEL via a second electrode portion included in the upper electrode TE and different from the first electrode portion. In the upper electrode TE according to the sixth modification, a third electrode portion different from the first electrode portion and the second electrode portion may be provided between the first electrode portion and the conductor 27, as in the third modification.

3 Others

Figure 28:
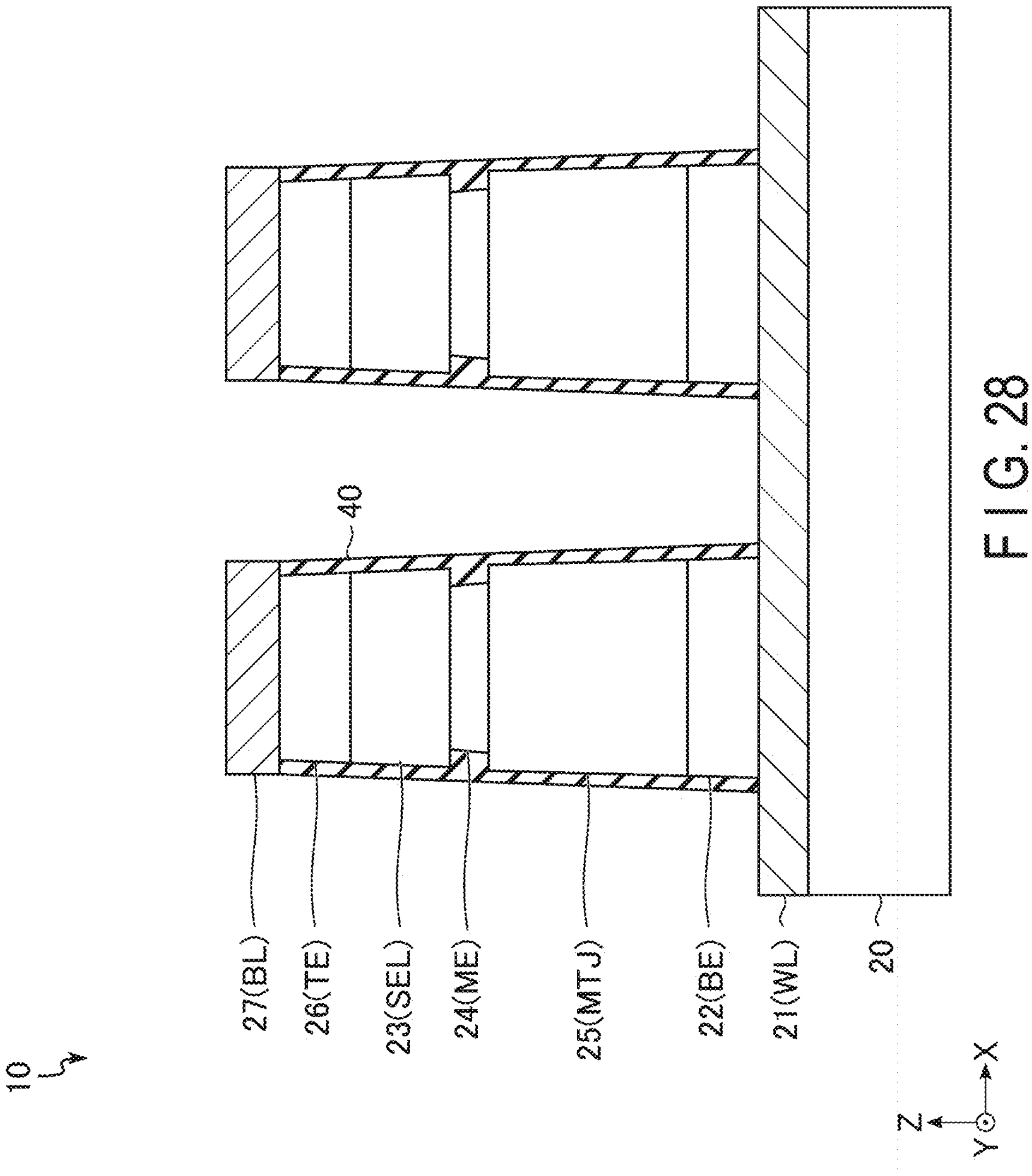
FIG. 28 is a cross-sectional view showing an example of a cross-sectional structure of a memory cell array used in a storage device according to another example.

In the embodiment, first modification, second modification, third modification, and fourth modification described above, the element 25 functioning as a variable resistance element is provided higher than the element 23; however, this is not restrictive. In the configurations of the embodiment, first modification, second modification, third modification, and fourth modification, the elements 23 and 25 may be interchanged as shown in FIG. 28. FIG. 28 is a cross-sectional view showing an example of a cross-sectional structure of a memory cell array used in a storage device according to another example. In this case, the outer diameter of the lower face of each of the plurality of electrodes 24 is smaller than the outer diameter of the upper face of the element 25 corresponding to that electrode 24. Thus, the area of the lower face of each of the plurality of electrodes 24 is smaller than the area of the upper face of the element 25 corresponding to that electrode 24. In addition, the outer diameter of the upper face of each of the plurality of electrodes 24 is smaller than the outer diameter of the lower face of the element 23 corresponding to that electrode 24. Thus, the area of the upper face of each of the plurality of electrodes 24 is smaller than the area of the lower face of the element 23 corresponding to that electrode 24.

In FIG. 28, the intermediate electrode ME in contact with the switching element SEL is shown as being composed of one portion; however, this is not restrictive. In another example, a plurality of electrode portions may be stacked as the intermediate electrode ME. In this case, the intermediate electrode ME may be configured such that the face (upper face) of one electrode portion (first electrode portion) of the plurality of electrode portions, the face being on the side of the switching element SEL, is in contact with a larger-area face in the stacked layer structure. More specifically, like the intermediate electrodes ME according to the embodiment and the first modification, the intermediate electrode ME may be composed of a plurality of electrode portions, and the first electrode portion may be in contact with the switching element SEL. Like the intermediate electrodes ME according to the second and third modifications, the intermediate electrode ME may be composed of a plurality of electrode portions, and the first electrode portion may be in contact with the switching element SEL via a second electrode portion included in the intermediate electrode ME and different from the first electrode portion. In the intermediate electrode ME according to another example, a third electrode portion different from the first electrode portion and the second electrode portion may be provided between the first electrode portion and the conductor 21, as in the third modification.

In the embodiment, first modification, second modification, third modification, and fourth modification described above, at least a portion of any of the electrodes 22, 24, and 26 that is in contact with the element 23 is circular or ring-shaped in the XY plane; however, this is not restrictive. At least a portion of any of the electrodes 22, 24, and 26 that is in contact with the element 23 may be rectangular or have any other desired shape in the XY plane, for example. It is sufficient that the face of at least a portion of the electrodes on the side of the element 23 is in contact with a larger-area face of the element 23 in the stacked layer structure, or a larger-area face of another portion of the electrode. This configuration can be formed, for example, by changing the shape of the region OP when the electrode portion **24*a* is formed in the second modification using the mask M3**.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A storage device comprising:
- a stacked layer structure comprising a switching element, an electrode including a first electrode portion, and a variable resistance element, which are stacked in a first direction,
- wherein:
- the switching element and the electrode are in contact with each other in the first direction,
- a first face of the first electrode portion on a side of the switching element is in contact with a second face that is inside the stacked layer structure and that is larger than the first face, and
- the switching element is sandwiched between the electrode and the variable resistance element in the first direction.

2. The device of claim 1, wherein the first electrode portion is circular in a plane perpendicular to the first direction.

3. The device of claim 1, wherein the first electrode portion is ring-shaped in a plane perpendicular to the first direction.

4. The device of claim 1, wherein the second face is a face of the switching element.

5. The device of claim 4, wherein the electrode is composed only of the first electrode portion.

6. The device of claim 4, wherein;
- the electrode further includes a second electrode portion, and
- the first electrode portion is sandwiched between the second electrode portion and the switching element in the first direction.

7. The device of claim 1, wherein;
- the electrode further includes a second electrode portion, and
- the second face is a face of the second electrode portion that is on a side of the first electrode portion.

8. The device of claim 7, wherein:
- the electrode further includes a third electrode portion, and
- the first electrode portion is sandwiched between the third electrode portion and the second electrode portion in the first direction.

9. The device of claim 1, further comprising:

first wiring extending in a second direction perpendicular to the first direction, wherein the electrode is provided on the first wiring.

10. The device of claim 1, wherein the switching element is a two-terminal switching element.

11. The device of claim 1, wherein the switching element includes a chalcogenide material.

12. The device of claim 1, wherein the switching element includes at least one element selected from Group V elements and Group VI elements.

13. The device of claim 1, wherein the variable resistance element is a magnetoresistance effect element.

14. The device of claim 13, wherein:

the magnetoresistance effect element includes:

a first ferromagnetic layer;

a second ferromagnetic layer;

a third ferromagnetic layer provided on a side of the second ferromagnetic layer opposite to the first ferromagnetic layer;

a first nonmagnetic layer provided between the first ferromagnetic layer and the second ferromagnetic layer; and a second nonmagnetic layer provided between the second ferromagnetic layer and the third ferromagnetic layer, and the first nonmagnetic layer includes an oxide of magnesium (Mg).

15. The device of claim 14, wherein the second nonmagnetic layer includes at least one element selected from a group including ruthenium (Ru), osmium (Os), rhodium (Rh), iridium (Ir), vanadium (V), and chromium (Cr).

16. The device of claim 15, wherein the third ferromagnetic layer is provided between a substrate and the second ferromagnetic layer.

17. The device of claim 16, wherein the second ferromagnetic layer and the third ferromagnetic layer are coupled to each other antiferromagnetically.

* * * * *